(12) United States Patent
Hashimoto

(10) Patent No.: US 6,507,095 B1
(45) Date of Patent: Jan. 14, 2003

(54) WIRING BOARD, CONNECTED BOARD AND SEMICONDUCTOR DEVICE, METHOD OF MANUFACTURE THEREOF, CIRCUIT BOARD, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/701,138
(22) PCT Filed: Mar. 23, 2000
(86) PCT No.: PCT/JP00/01769
§ 371 (c)(1),
(2), (4) Date: Nov. 24, 2000
(87) PCT Pub. No.: WO00/59033
PCT Pub. Date: Oct. 5, 2000

(30) Foreign Application Priority Data

Mar. 25, 1999 (JP) .......................................... 11-081028
Jul. 28, 1999 (JP) .......................................... 11-213183

(51) Int. Cl.⁷ .......................................... H01L 23/495
(52) U.S. Cl. .................... 257/676; 257/668; 257/701; 257/690; 257/693
(58) Field of Search ............................... 257/700, 702, 257/706, 787, 709, 712, 711, 676, 668, 690, 693, 675, 671, 783, 698, 701

(56) References Cited

U.S. PATENT DOCUMENTS

| 5,229,916 A | * | 7/1993 | Frankeny et al. ........... 257/668 |
| 5,602,419 A | * | 2/1997 | Takeda et al. ............... 257/668 |
| 5,629,835 A |   | 5/1997 | Mahulikar et al. |
| 5,679,978 A |   | 10/1997 | Kawahara et al. |
| 5,905,303 A | * | 5/1999 | Kata et al. ................... 257/701 |
| 6,093,036 A | * | 7/2000 | Tohgo et al. ................. 439/83 |
| 6,175,151 B1 | * | 1/2001 | Hashimoto ................... 257/676 |

FOREIGN PATENT DOCUMENTS

| EP | 0 853 337 A1 | 7/1998 |
| JP | A-6-69277 | 3/1994 |
| JP | A-7-193098 | 7/1995 |
| JP | A-7-221132 | 8/1995 |
| JP | A-9-232381 | 9/1997 |
| JP | A-10-125705 | 5/1998 |
| JP | A-10-313072 | 11/1998 |
| JP | A-11-243118 | 9/1999 |
| JP | A-11-260950 | 9/1999 |

* cited by examiner

Primary Examiner—David Nelms
Assistant Examiner—Andy Huynh
(74) Attorney, Agent, or Firm—Oliff & Berridge, PLC

(57) ABSTRACT

A wiring board comprises a substrate (10) in which an opening (14) is formed, a wiring pattern (20) formed on one surface of the substrate (10) and having a bent portion (22) intruding into the opening (14) and protruding from the other surface of the substrate (10), and a resin 26 with which an inside of the bent portion (22) is filled and allowing deformation to a certain degree while preventing large deformation, and the bent portion (22) forms the external terminals of the semiconductor device.

101 Claims, 15 Drawing Sheets

F I G. 4
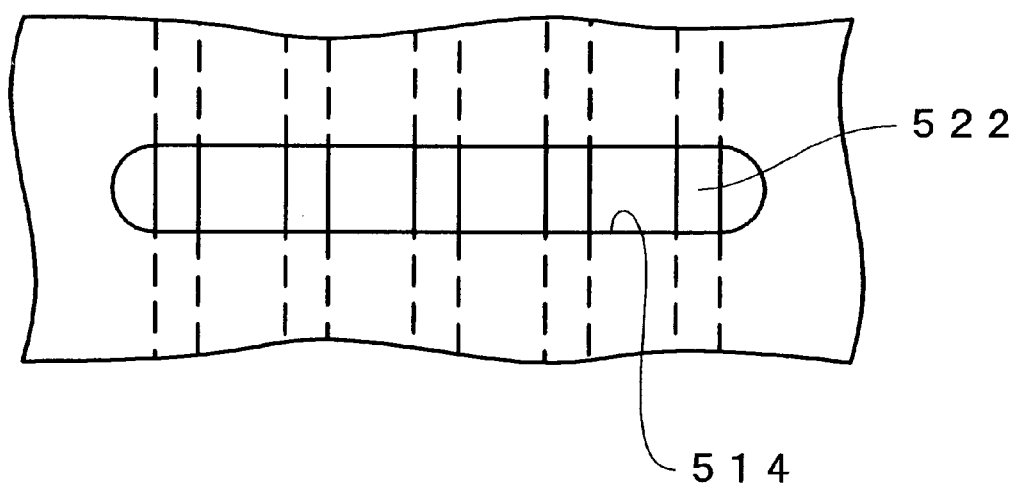

WIRING BOARD, CONNECTED BOARD AND SEMICONDUCTOR DEVICE, METHOD OF MANUFACTURE THEREOF, CIRCUIT BOARD, AND ELECTRONIC INSTRUMENT

TECHNICAL FILED

The present invention relates to a wiring board, a connected board and a semiconductor device, method of manufacture thereof, a circuit board, and an electronic instrument.

BACKGROUND OF ART

Among compact semiconductor devices are such as CSP (Chip Size/Scale Package) or BGA (Ball Grid Array) type packages, in which solder balls are used as external terminals.

The solder balls are positioned and mounted on a wiring board, are fused in a reflow process and bonded to a wiring pattern, and are then washed. For this reason, expensive ball mounter equipment, reflow equipment and washing equipment are required. Moreover, in the reflow process thermal stress is applied, and in the washing process solvent stress is applied, and as a result the package is damaged.

DISCLOSURE OF THE INVENTION

The present invention was devised in the light of the above described problems, with the objective of providing a wiring board, a connected board and a semiconductor device, method of manufacture thereof, a circuit board, and an electronic instrument which make it possible to carry out processing without expensive equipment, and to avoid damage to the package.

(1) A wiring board of the present invention comprises:

a substrate in which an opening is formed; and a wiring pattern having a bent portion, wherein the wiring pattern is formed on one surface of the substrate so that the opening and the bent portion overlap each other, and wherein an inside of the bent portion is filled with a stress-absorbing material.

According to the present invention, a part of the wiring pattern intrudes into the opening. This bent portion can be used as the external terminals of the semiconductor device or the like. Therefore, processing can be carried out without expensive equipment, and damage to the package can be avoided. In the present invention, by means of the stress-absorbing material, stress applied to the bent portion is absorbed.

(2) In this wiring board, the bent portion may be formed having a height such as not to protrude from another surface of the substrate.

(3) In this wiring board, the bent portion may constitute a protrusion protruding from the other surface of the substrate.

According to the present invention, a part of the wiring pattern intrudes into the opening, and the bent portion protrudes from the opposite surface of the substrate. This bent portion can be used as the external terminals of the semiconductor device or the like, and therefore solder balls can be omitted. Therefore, processing can be carried out without expensive equipment, and damage to the package can be avoided.

(4) In this wiring board, a protective member thicker than a protruding height of the protrusion may be provided on the other surface of the substrate.

By means of this, the bent portion is protected by the protective member, and deformation is prevented. A semiconductor device or the like using such a wiring board can be mounted on a circuit board after releasing the protective member.

(5) In this wiring board, an adhesive may be interposed between the substrate and the wiring pattern.

By means of this, stress applied to the bent portion can be absorbed by the adhesive.

(6) In this wiring board, the bent portion of the wiring pattern may be narrower than a diameter of the opening, and forms a bent interconnect.

(7) In this wiring board, the bent portion of the wiring pattern may be formed by ending a portion of a land larger than the opening.

(8) In this wiring board, an end of the bent portion of the wiring pattern may be fractured.

In this way, since the bent portion is electrically connected to the wiring pattern even though its end is fractured, it can be used as the external terminals.

(9) In this wiring board, an end of the bent portion of the wiring pattern may be terminated to avoid the surface of the substrate.

In this way, the end of the bent portion, even if not supported by the substrate, is electrically connected to the wiring pattern, and can therefore be used as the external terminals.

(10) In this wiring board, the opening may be a slit, and a plurality of the bent portions may be formed within each the opening.

(11) A wiring board of the present invention comprises:

a substrate in which an opening is formed; and a wiring pattern formed on one surface of the substrate, and having a bent portion protruding from the one surface in the direction opposite to the opening.

According to the present invention, the bent portion formed by part of the wiring pattern protruding can be used as the external terminals of the semiconductor device or the like. Therefore, processing can be carried out without expensive equipment, and damage to the package can be avoided.

(12) In this wiring board, an adhesive may be interposed between the substrate and the wiring pattern.

By means of this, stress applied to the bent portion can be absorbed by the adhesive.

(13) In this wiring board, a concavity formed on the concave surface of the bent portion of the wiring pattern may be filled with resin.

By means of this, not only is the form of the bent portion maintained by the resin with which the concavity is filled, but also stress applied to the bent portion can be absorbed by the resin.

(14) In this wiring board, the bent portion of the wiring pattern may be narrower than a diameter of the opening, and forms a bent interconnect.

(15) In this wiring board, the bent portion of the wiring pattern may be formed by bending a portion of a land larger than the opening.

(16) In this wiring board, an end of the bent portion of the wiring pattern may be fractured.

In this way, since the bent portion is electrically connected to the wiring pattern even though its end is fractured, it can be used as the external terminals.

(17) In this wiring board, an end of the bent portion of the wiring pattern may be terminated to avoid the surface of the substrate.

In this way, the end of the bent portion, even if not supported by the substrate, is electrically connected to the wiring pattern, and can therefore be used as the external terminals.

(18) In this wiring board, the opening may be a slit, and a plurality of the bent portions may be formed within each the opening.

(19) A wiring board of the present invention comprises:

a substrate in which an opening is formed; and a wiring pattern having a bent portion, wherein the wiring pattern is formed on one surface of the substrate so that the opening and the bent portion overlap each other, and wherein a sealing material sealing the opening is provided on a concave side of the bent portion.

According to the present invention, the concave side of the bent portion can also be used as an electrical connection region, with the sealing material interposed.

(20) In this wiring board, an inside of the bent portion may be filled with the sealing material formed of a conductive substance.

By means of this, electrical connection with the inner surface of the bent portion can be achieved, with the conductive substance interposed.

(21) In this wiring board, an inside of the bent portion may be filled with an insulating resin, and the sealing material may be a conductive substance, formed on the insulating resin.

By means of this, on the insulating resin, electrical connection with the wiring pattern can be achieved with the conductive substance interposed.

(22) In this wiring board, the sealing material may be provided over the concavity to reach as far as the wiring pattern, and leaving an inside of the bent portion hollow.

By means of this, since the bent portion is easily deformable, stress can be absorbed by the bent portion.

(23) A wiring board of the present invention comprises:

a substrate in which an opening is formed; and a wiring pattern formed on one surface of the substrate, and having a bent portion protruding from the one surface in the direction opposite to the opening, wherein the opening of the substrate and an inside of the bent portion are filled with a sealing material sealing the opening.

According to the present invention, the concave side of the bent portion can also be used as an electrical connection region, with the sealing material interposed.

(24) A connected board of the present invention includes a plurality of wiring boards each of which has a wiring pattern formed on a substrate, wherein a bent portion is formed on the wiring pattern of at least one of the plurality of wiring boards, and wherein the bent portion is connected to the wiring pattern of another one of the wiring boards being different from the one of the wiring boards on which the bent portion is formed.

According to the present invention, the wiring patterns of a plurality of wiring boards can be connected without causing a short-circuit, by using the height of the bent portion,.

(25) In this connected board, the substrate of the wiring board in which the bent portion may be formed is provided with an opening, and the bent portion may be formed to overlap with the opening.

(26) In this connected board, the wiring pattern, on which the bent portion is formed, may be formed on one surface of the substrate, and the bent portion may be formed to protrude from the one surface in the direction opposite to the opening.

(27) In this connected board, the wiring pattern, on which the bent portion is formed, may be formed on one surface of the substrate, and the bent portion may be formed in the opening along the direction of another surface of the substrate.

(28) In this connected board, the wiring pattern and the bent portion may be connected by diffusing respective materials thereof.

(29) In this connected board, the wiring pattern and the bent portion may be connected by a conductive member.

(30) A connected board of the present invention comprises:

a plurality of wiring boards each of which has a wiring pattern formed on a substrate, wherein, on at least one of the plurality of wiring boards, an opening is formed in the substrate, a bent portion is formed in the wiring pattern, the opening and the bent portion overlap each other, the wiring pattern is formed on one surface of the substrate, and a conductive substance is provided on the concave side of the bent portion, and wherein the bent portion is connected to the wiring pattern of another one of the wiring boards being different from the one of the wiring boards on which the bent portion is formed.

According to the present invention, the wiring patterns of a plurality of wiring boards can be connected without causing a short-circuit, by using the height of the bent portion. According to the present invention, the concave side of the bent portion can also be used as an electrical connection region, with the conductive substance interposed.

(31) In this connected board, the interior of the bent portion may be filled with the conductive substance.

By means of this, electrical connection with the inner surface of the bent portion can be achieved, with the conductive substance interposed.

(32) In this connected board, an inside of the bent portion may be filled with an insulating resin, and the conductive substance may be provided on the insulating resin to reach as far as the wiring pattern.

By means of this, on the insulating resin, electrical connection with the wiring pattern can be achieved with the conductive substance interposed.

(33) In this connected board, the conductive substance may be provided over the concavity to reach as far as the wiring pattern, leaving an inside of the bent portion hollow.

By means of this, since the bent portion is easily deformable, stress can be absorbed by the bent portion.

(34) A connected board of the present invention comprises:

a plurality of wiring boards each of which has a wiring pattern formed on a substrate, wherein, on at least one of the plurality of wiring boards, an opening is formed in the substrate, the wiring pattern is formed on one surface of the substrate and having a bent portion protruding from the one surface in the direction opposite to the opening, and the opening of the substrate and an inside of the bent portion are filled with a conductive substance, and wherein the bent portion is connected to the wiring pattern of another one of the wiring boards being different from the one of the wiring boards on which the bent portion is formed.

According to the present invention, the wiring patterns of a plurality of wiring boards can be connected without causing a short-circuit, by using the height of the bent portion. According to the present invention, the concave side of the bent portion can also be used as an electrical connection region, with the conductive substance interposed.

(35) A semiconductor device of the present invention comprises:

the wiring board described above; and at least one semiconductor chip mounted on the substrate of the wiring board.

According to the present invention, a part of the wiring pattern intrudes into the opening. This bent portion can be used as the external terminals of the semiconductor device. Therefore, processing can be carried out without expensive equipment, and damage to the package can be avoided.

(36) In this semiconductor device, the semiconductor chip may be bonded to the substrate being interposed with an anisotropic conductive material constituted by an adhesive in which conductive particles are dispersed.

(37) In this semiconductor device, a part of the anisotropic conductive material may be the stress-absorbing material with which the bent portion is filled.

By means of this, since deformation of the bent portion is allowed by the anisotropic conductive material, stress applied to the bent portion is absorbed.

(38) In this semiconductor device, the opening as defined above may be formed in at least one of inside and outside a mounting region of the semiconductor chip on the substrate.

When the bent portion is formed on the substrate as external terminals inside the mounting region of the semiconductor chip, this semiconductor device is a fan-in type of semiconductor device, when the bent portion is formed on the substrate as external terminals inside and outside the mounting region of the semiconductor chip, this semiconductor device is a fan-in/out type of semiconductor device, and when the bent portion is formed on the substrate as external terminals outside the mounting region of the semiconductor chip, this semiconductor device is a fan-out type of semiconductor device.

(39) This semiconductor device may further comprise: a plurality of the semiconductor chips, and a part of the substrate may be bent, and the plurality of semiconductor chips are stacked.

This is a multi-chip package semiconductor device.

(40) In this semiconductor device, the opening as defined above may be formed outside the mounting region of the semiconductor chip on the substrate, and a part of the substrate may be bent, and a portion of the substrate excluding the mounting region of the semiconductor chip is adhered to the semiconductor chip.

According to the present invention, the bent portion formed by part of the wiring pattern protruding can be used as the external terminals of the semiconductor device. Therefore, processing can be carried out without expensive equipment, and damage to the package can be avoided.

By means of this, since the bent portion forming the external terminals is formed outside the mounting region of the semiconductor chip, the stress generated by differences in the coefficients of thermal expansion between the semiconductor chip and the substrate does not affect the bent portion. Since the substrate can be bent, the semiconductor device is made more compact.

(41) A semiconductor device of the present invention comprises:

the wiring board described above; and at least one semiconductor chip mounted on the wiring board.

According to the present invention, the effect of the above-described wiring board can be obtained.

(42) In this semiconductor device, the semiconductor chip may be bonded to the substrate being interposed with an anisotropic conductive material constituted by an adhesive in which conductive particles are dispersed.

(43) In this semiconductor device, a part of the anisotropic conductive material may fill the bent portion described above.

(44) In this semiconductor device, the opening described above may be formed in at least one of inside and outside a mounting region of the semiconductor chip on the substrate.

When the bent portion is formed on the substrate as external terminals inside the mounting region of the semiconductor chip, this semiconductor device is a fan-in type of semiconductor device, when the bent portion is formed on the substrate as external terminals inside and outside the mounting region of the semiconductor chip, this semiconductor device is a fan-in/out type of semiconductor device, and when the bent portion is formed on the substrate as external terminals outside the mounting region of the semiconductor chip, this semiconductor device is a fan-out type of semiconductor device.

(45) This semiconductor may further comprise:

a plurality of the semiconductor chips, and a part of the substrate may be bent, and the plurality of semiconductor chips are stacked.

This is a multi-chip package semiconductor device.

(46) In this semiconductor device, the opening described above may be formed outside the mounting region of the semiconductor chip on the substrate, and a part of the substrate may be bent, and a portion of the substrate excluding the mounting region of the semiconductor chip is adhered to the semiconductor chip.

By means of this, since the bent portion forming the external terminals is formed outside the mounting region of the semiconductor chip, the stress generated by differences in the coefficients of thermal expansion between the semiconductor chip and the substrate does not affect the bent portion. Since the substrate can be bent, the semiconductor device is made more compact.

(47) A semiconductor device of the present invention comprises:

the wiring board described above; and at least one semiconductor chip mounted on the substrate of the wiring board.

According to the present invention, the bent portion can be used as the external terminals of the semiconductor device. Therefore, processing can be carried out without expensive equipment, and damage to the package can be avoided. According to the present invention, the concave side of the bent portion of the wiring board can also be used as an electrical connection region, with the conductive substance interposed.

(48) A semiconductor device of the present invention is a semiconductor device comprising:

the wiring board described above; and at least one semiconductor chip mounted on the substrate of the wiring board.

According to the present invention, the bent portion can be used as the external terminals of the semiconductor device. Therefore, processing can be carried out without expensive equipment, and damage to the package can be avoided. According to the present invention, the concave side of the bent portion of the wiring board can also be used as an electrical connection region, with the conductive substance interposed.

(49–52) A circuit board of the present invention has the above described semiconductor device mounted thereon.

(53–56) An electronic instrument of the present invention has the above described semiconductor device.

(57) A method of manufacturing a wiring board of the present invention comprises:

a step of forming a bent portion by bending a part of a conductive leaf formed on one surface of a substrate and passing over an opening, in the direction of another surface and into the opening; and a step of filling the bent portion with a stress-absorbing material.

According to the present invention, a part of the conductive leaf intrudes into the opening. The bent portion can be used as the external terminals of the semiconductor device or the like. Therefore, processing can be carried out without expensive equipment, and damage to the package can be avoided. In the present invention, by means of the stress-absorbing material, stress applied to the bent portion is absorbed.

(58) In this method of manufacturing a wiring board, the bent portion may be formed to have a height such as not to protrude from the other surface of the substrate.

(59) In this method of manufacturing a wiring board, the bent portion may protrude from the other surface of the substrate to form a protrusion.

According to the present invention, a part of the conductive leaf intrudes into the opening, and the bent portion protrudes from the opposite surface of the substrate. The bent portion can be used as the external terminals of the semiconductor device or the like, and therefore solder balls can be omitted. Therefore, processing can be carried out without expensive equipment, and damage to the package can be avoided.

(60) In this method of manufacturing a wiring board, in the step of forming the bent portion, the opening may be mounted on the other surface of the substrate by positioning the opening on a concave die corresponding to the bent portion, and a convex die corresponding to the bent portion maybe pressed onto the conductive leaf from the one surface of the substrate.

(61) This method of manufacturing a wiring board may further comprise a step of providing a protective member which is thicker than a height of the protrusion, on the other surface of the substrate.

By means of this, the bent portion is protected by the protective member, and deformation is prevented. A semiconductor device or the like using such a wiring board can be mounted on a circuit board after releasing the protective member.

(62) In this method of manufacturing a wiring board, an adhesive may be interposed between the substrate and the conductive leaf, and the step of forming the bent portion may be carried out while drawing the adhesive into the opening.

By means of this, since an adhesive is interposed between the substrate and the conductive leaf, the conductive leaf is made able to move, and the step of drawing a part of the conductive leaf into the opening is made easier to carry out.

(63) In this method of manufacturing a wiring board, in the step of forming the bent portion, the bent portion may be formed while fracturing the end.

In this way, if electrical conduction with the conductive leaf is assured, a part of the bent portion may be fractured.

(64) In this method of manufacturing a wiring board, in the step of forming the bent portion, an end of the bent portion may be terminated to avoid the surface of the substrate.

In this way, if electrical conduction with the conductive leaf is assured, the end of the bent portion need not be supported by the substrate.

(65) This method of manufacturing a wiring board may further comprise a step of patterning the conductive leaf to form a wiring pattern, after the step of forming the bent portion.

This is the method in which after forming the bent portion the wiring pattern is formed.

(66) This method of manufacturing a wiring board may further comprise:

a step of adhering a conductive leaf to the substrate; and a step of patterning the conductive leaf to form a wiring pattern, and the step of forming the bent portion may be carried out on the conductive leaf as the wiring pattern.

This is the method in which after forming the wiring pattern the bent portion is formed.

(67) This method of manufacturing a wiring board may further comprise:

a step of applying plating to the convex surface of the bent portion, after forming the wiring pattern.

(68) A method of manufacturing a wiring board of the present invention comprises a step of forming a bent portion by bending a part of a conductive leaf formed on one surface of a substrate so as to protrude from the one surface in the direction opposite to the opening.

According to the present invention, the bent portion formed by part of the wiring pattern protruding can be used as the external terminals of the semiconductor device or the like. Therefore, processing can be carried out without expensive equipment, and damage to the package can be avoided.

(69) In this method of manufacturing a wiring board, an adhesive may be interposed between the substrate and the conductive leaf, and the step of forming the bent portion may be carried out while drawing the adhesive into the opening.

By means of this, since an adhesive is interposed between the substrate and the conductive leaf, the conductive leaf is made able to move, and the step of drawing a part of the conductive leaf into the opening is made easier to carry out.

(70) In this method of manufacturing a wiring board,
in the step of forming the bent portion, the bent portion may be formed while fracturing the end.

In this way, if electrical conduction with the conductive leaf is assured, a part of the bent portion may be fractured.

(71) In this method of manufacturing a wiring board,
in the step of forming the bent portion, an end of the bent portion may be terminated to avoid the surface of the substrate.

In this way, if electrical conduction with the conductive leaf is assured, the end of the bent portion need not be supported by the substrate.

(72) This method of manufacturing a wiring board may further comprise a step of filling a concavity formed by the concave surface of the bent portion of the conductive leaf with resin, after the step of forming the bent portion.

By means of this, not only is the form of the bent portion maintained by the resin with which the concavity is filled, but also stress applied to the bent portion can be absorbed by the resin.

(73) This method of manufacturing a wiring board may further comprise a step of patterning the conductive leaf to form a wiring pattern, after the step of forming the bent portion.

This is the method in which after forming the bent portion the wiring pattern is formed.

(74) This method of manufacturing a wiring board may further comprise:
a step of adhering a conductive leaf to the substrate; and
a step of patterning the conductive leaf to form a wiring pattern,
and the step of forming the bent portion may be carried out on the conductive leaf as the wiring pattern.

This is the method in which after forming the wiring pattern the bent portion is formed.

(75) This method of manufacturing a wiring board may further comprise a step of applying plating to the convex surface of the bent portion, after forming the wiring pattern.

(76) A method of manufacturing a wiring board of the present invention comprises:
a step of forming a bent portion by bending a part of a conductive leaf formed on one surface of a substrate and passing over an opening, in the direction of another surface and into the opening; and
a step of a step of providing a conductive substance on the concave side of the bent portion.

According to the present invention, the bent portion formed from a part of the conductive leaf can be used as the external terminals of the semiconductor device or the like. Therefore, processing can be carried out without expensive equipment, and damage to the package can be avoided. In the present invention, the concave side of the bent portion can also be used as an electrical connection region, with the conductive substance interposed.

(77) In this method of manufacturing a wiring board,
an inside of the bent portion may be filled with the conductive substance.

By means of this, electrical connection with the inner surface of the bent portion can be achieved, with the conductive substance interposed.

(78) In this method of manufacturing a wiring board,
an inside of the bent portion may be filled with an insulating resin, and
the conductive substance may be provided on the insulating resin to reach as far as the wiring pattern.

By means of this, over the insulating resin, electrical connection with the wiring pattern can be achieved with the conductive substance interposed.

(79) In this method of manufacturing a wiring board,
the conductive substance may be provided over the concavity to reach as far as the wiring pattern, leaving an inside of the bent portion hollow.

By means of this, since the bent portion is easily deformable, stress can be absorbed by the bent portion.

(80) A method of manufacturing a wiring board of the present invention comprises:
a step of forming a bent portion by bending a part of a conductive leaf formed on one surface of a substrate so as to protrude from the one surface in the direction opposite to the opening; and
a step of filling the opening of the substrate and an inside of the bent portion with a conductive substance.

According to the present invention, the bent portion formed from a part of the conductive leaf can be used as the external terminals of the semiconductor device or the like. Therefore, processing can be carried out without expensive equipment, and damage to the package can be avoided. In the present invention, the concave side of the bent portion can also be used as an electrical connection region, with the conductive substance interposed.

(81) A method of manufacturing a connected board of the present invention in which a plurality of wiring boards are connected, each of the wiring boards having a wiring pattern formed on a substrate, the method comprising at least:
a step of forming a bent portion on the wiring pattern of at least one of the plurality of wiring boards; and
a step of connecting the bent portion to the wiring pattern of another of the wiring boards different from the one of the wiring boards on which the bent portion is formed.

According to the present invention, the bent portion connects together the wiring patterns of the plurality of wiring boards. Therefore, processing can be carried out without expensive equipment, and damage to the package can be avoided.

(82) In this method of manufacturing a connected board,
the substrate of the wiring board in which the bent portion may be formed is provided with an opening, and
the bent portion may be formed to overlap with the opening.

(83) In this method of manufacturing a connected board,
the wiring pattern, on which the bent portion may be formed, is formed on one surface of the substrate, and
the bent portion may be formed to protrude from the one surface in the direction opposite to the opening.

(84) In this method of manufacturing a connected board,
the wiring pattern, on which the bent portion is formed, may be formed on one surface of the substrate, and
the bent portion may be formed in the opening along the direction of another surface of the substrate.

(85) In this method of manufacturing a connected board,
the bent portion and the wiring pattern of another of the wiring boards different from the one of the wiring boards on which the bent portion is formed may be connected by diffusing respective materials thereof.

(86) In this method of manufacturing a connected board, the bent portion and the wiring pattern of another of the wiring boards different from the one of the wiring boards on which the bent portion is formed may be connected by a conductive member.

(87) A method of manufacturing a connected board of the present invention in which a plurality of wiring boards are connected, each of the wiring boards having a wiring pattern formed on a substrate, wherein an opening is formed in the substrate for at least one of the plurality of wiring boards, wherein the method comprises:

a step of forming a bent portion in the wiring pattern of the substrate in which the opening is formed, so that the opening and the bent portion overlap each other;

a step of providing a conductive substance on the concave side of the bent portion; and a step of connecting the bent portion and the wiring pattern of another one of the wiring boards being different from the one of the wiring boards on which the bent portion is formed.

According to the present invention, the bent portion connects together the wiring patterns of the plurality of wiring boards. Therefore, processing can be carried out without expensive equipment, and damage to the package can be avoided. In the present invention, the concave side of the bent portion can also be used as an electrical connection region, with the conductive substance interposed.

(88) In this method of manufacturing a connected board, an inside of the bent portion may be filled with the conductive substance.

By means of this, electrical connection with the inner surface of the bent portion can be achieved, with the conductive substance interposed.

(89) In this method of manufacturing a connected board, an inside of the bent portion may be filled with an insulating resin, and the conductive substance may be provided on the insulating resin to reach as far as the wiring pattern.

By means of this, over the insulating resin, electrical connection with the wiring pattern can be achieved with the conductive substance interposed.

(90) In this method of manufacturing a connected board, the conductive substance may be provided over the concavity to reach as far as the wiring pattern, leaving an inside of the bent portion hollow.

By means of this, since the bent portion is easily deformable, stress can be absorbed by the bent portion.

(91) A method of manufacturing a connected board of the present invention in which a plurality of wiring boards are connected, each of the wiring boards having a wiring pattern formed on a substrate, wherein an opening is formed in the substrate for at least one of the plurality of wiring boards, and the wiring pattern is formed on one surface of the substrate, wherein the method comprises:

a step of forming a bent portion by bending the wiring pattern of the substrate, in which the opening is formed to protrude from the one surface in the direction opposite to the opening;

a step of filling the opening of the substrate and an inside of the bent portion with a conductive substance; and a step of connecting the bent portion and the wiring pattern of another one of the wiring boards being different from the one of the wiring boards on which the bent portion is formed.

According to the present invention, the bent portion connects together the wiring patterns of the plurality of wiring boards. Therefore, processing can be carried out without expensive equipment, and damage to the package can be avoided. In the present invention, the concave side of the bent portion can also be used as an electrical connection region, with the conductive substance interposed.

(92) A method of manufacturing a semiconductor device of the present invention comprises a step of mounting at least one semiconductor chip on the substrate of a wiring board fabricated by the method described above.

According to the present invention, a part of the wiring pattern intrudes into the opening. The bent portion can be used as the external terminals of the semiconductor device. Therefore, the process of semiconductor device fabrication can be carried out without expensive equipment, and damage to the package can be avoided.

(93) In this method of manufacturing a semiconductor device, in the step of mounting the semiconductor chip, the semiconductor chip is bonded to the substrate being interposed with an anisotropic conductive material constituted by an adhesive in which conductive particles are dispersed.

(94) In this method of manufacturing a semiconductor device, a plurality of the semiconductor chips may be mounted on the substrate, the substrate may be a flexible substrate, and a part of the substrate may be bent, and the plurality of semiconductor chips may be stacked.

By this means, a multi-chip package semiconductor device can be obtained.

(95) In this method of manufacturing a semiconductor device, the substrate may be a flexible substrate, and a part of the substrate may be bent, and an upper surface of the semiconductor chip may be adhered to the substrate.

By means of this, the bent portion forming the external terminals is formed outside the mounting region of the semiconductor chip. Therefore, a semiconductor device can be obtained in which the stress generated by differences in the coefficients of thermal expansion between the semiconductor chip and the substrate does not affect the bent portion. Since the substrate can be bent, a compact semiconductor device is obtained.

(96) A method of manufacturing a semiconductor device of the present invention comprises a step of mounting at least one semiconductor chip on the substrate of a wiring board fabricated by the method described above.

According to the present invention, a part of the wiring pattern intrudes into the opening. The bent portion can be used as the external terminals of the semiconductor device. Therefore, the process of semiconductor device fabrication can be carried out without expensive equipment, and damage to the package can be avoided.

(97) In this method of manufacturing a semiconductor device, in the step of mounting the semiconductor chip, the semiconductor chip may bonded to the substrate being interposed with an anisotropic conductive material constituted by an adhesive in which conductive particles are dispersed.

(98) In this method of manufacturing a semiconductor device, a plurality of the semiconductor chips may be mounted on the substrate, the substrate may be a flexible substrate, and a part of the substrate may be bent, and the plurality of semiconductor chips are stacked.

By this means, a multi-chip package semiconductor device can be obtained.

(99) In this method of manufacturing a semiconductor device, the substrate may be a flexible substrate, and a part of the substrate may be bent, and an upper surface of the semiconductor chip may be adhered to the substrate.

By means of this, the bent portion forming the external terminals is formed outside the mounting region of the semiconductor chip. Therefore, a semiconductor device can be obtained in which the stress generated by differences in the coefficients of thermal expansion between the semiconductor chip and the substrate does not affect the bent portion. Since the substrate can be bent, a compact semiconductor device is obtained.

(100) A method of manufacturing a semiconductor device of the present invention comprises a step of mounting at least one semiconductor chip on the substrate of a wiring board fabricated by the method described above.

According to the present invention, the bent portion can be used as the external terminals of the semiconductor device. Therefore, the process of semiconductor device fabrication can be carried out without expensive equipment, and damage to the package can be avoided.

(101) A method of manufacturing a semiconductor device of the present invention comprises a step of mounting at least one semiconductor chip on the substrate of a wiring board fabricated by the method described above.

According to the present invention, the bent portion can be used as the external terminals of the semiconductor device. Therefore, the process of semiconductor device fabrication can be carried out without expensive equipment, and damage to the package can be avoided.

BRIEF DESCRIPTION OF THE DRAWINGS

FIG. 4 shows a modification embodiment of the present invention.

BEST MODE FOR CARRYING OUT THE INVENTION

The present invention is now described in terms of a number of preferred embodiments, with reference to the drawings.

First Embodiment

Figure 1:
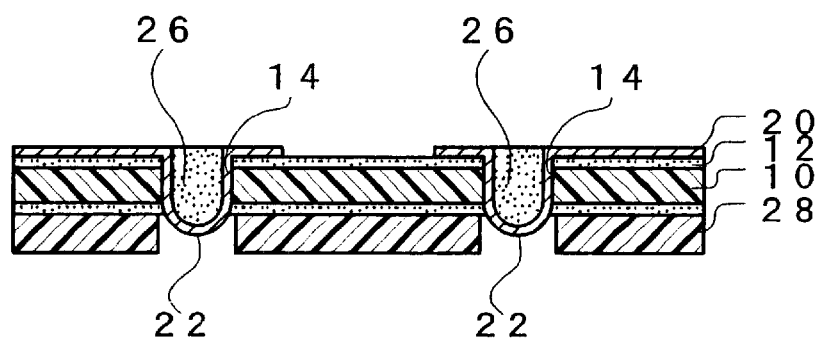
FIG. 1 shows a first embodiment of the wiring board of the present invention.

FIG. 1 shows a first embodiment of the wiring board to which the present invention is applied. The wiring board shown in FIG. 1 comprises a substrate 10 and a wiring pattern 20, and can therefore be used, for example, as an interposer of a semiconductor device.

The substrate 10 may be formed of either an organic or inorganic material, or may equally be a composite of the two. As an example of a substrate 10 formed of an organic material may be cited, for example, a flexible substrate of a polyimide resin. As a flexible substrate may also be used a tape as used in TAB technology. As a substrate 10 formed of an inorganic material may be cited, for example, a ceramic substrate or a glass substrate. As a composite of organic and inorganic materials may be cited, for example, a glass epoxy substrate.

On the substrate 10 is formed the wiring pattern 20. The wiring pattern 20 can be formed of copper or the like. The wiring pattern 20 is has a form corresponding to the electrodes of an electronic element such as a semiconductor chip to be mounted thereon, and may have lands formed for connection to the electrodes. The wiring pattern 20 may be adhered to the substrate 10 with an adhesive 12 interposed, forming a three-layer substrate. Alternatively, the wiring pattern 20 may be formed on the substrate 10 without an adhesive, forming a two-layer substrate. In a two-layer substrate, a thin film is formed by sputtering or the like, and then plating is carried out, to form the wiring pattern 20. Therefore, even in a two-layer substrate, the wiring pattern 20 has sufficient thickness to enable plastic processing. Alternatively, a built-up type of substrate constructed by laminating an insulating resin and a wiring pattern on a substrate, or a multi-layer substrate formed by laminating a plurality of substrates, or a double-sided substrate, and so on, may be used as the substrate 10.

In the substrate 10, a plurality of openings 14 is formed. The form of each of the openings 14 is circular, and the diameter may be approximately equal to that of a general external terminal. Alternatively, the openings 14 may be formed to be rectangular.

A part of the wiring pattern 20 intrudes into the openings 14. In more detail, the wiring pattern 20 is formed on one surface of the substrate 10, and a part intrudes into the openings 14 to form bent portions 22. A part of the wiring pattern 20, as shown in the drawings, may have bent portions 22 which protrude from the other surface of the substrate 10. Alternatively, as when the substrate 10 and a substrate 28 are considered together as a single substrate, the intrusion may be to be position such as not to project beyond the other surface of the substrate 10, to form the bent portions 22. The bent portions 22 form the external terminals of an electronic component such as a semiconductor device, and therefore preferably have the height and diameter of external terminals. The bent portions 22 may be of a form constructed with a dome-shaped end and a cylindrical body. For example, lands larger than the openings 14 may be bent to form bent portions 22 (dimples). The bent portions 22 are preferably easily deformable, and able to absorb stress. If the wiring pattern 20 is extended to form the bent portions 22, the bent portions 22 can be formed of a thin and easily deformable conductive layer.

Between the bent portions 22 and the walls of the openings 14, an adhesive 12 may or may not be interposed.

Figure 2:
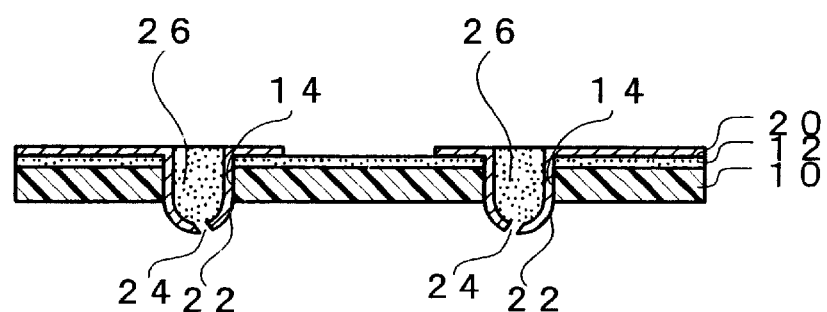
FIG. 2 shows a modification of the first embodiment of the wiring board of the present invention.
Figure 3:
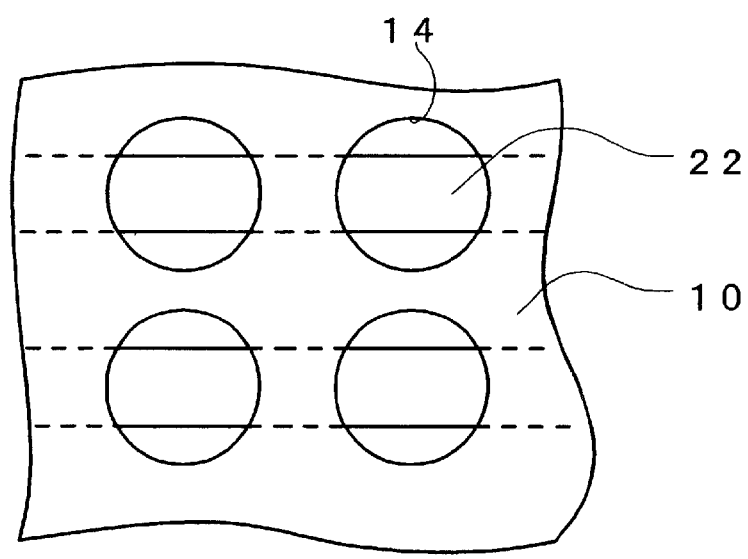
FIG. 3 shows a modification of the first embodiment of the wiring board of the present invention.

As a modification, as shown in FIG. 2, at the ends of the bent portions 22, a fracture 24 may be formed. Here, the formation of the fracture 24 is required to be such as to ensure the electrical conduction of the bent portions 22 with the portion of the wiring pattern 20 over the substrate 10. As the electrical conduction is ensured, the fracture 24 may be formed not only at the ends of the bent portions 22, but as far as the side portion. Alternatively, as shown in FIG. 3, the bent portions 22 may be formed by bending an interconnect whose width is less than the diameter of the openings 14. In more detail, one bent portion 22 is formed in one opening 14. By means of this, contact between adjacent bent portions 22, and particularly contact during the formation of the bent portions 22 can be prevented.

As shown in FIG. 4, an opening 514 may be a slit, and a plurality of bent portions 522 may be formed in a single opening 514.

The concavity formed on the surface of the bent portions 22 opposite to the convex surface is preferably filled with a resin 26. As the resin 26 can be used, for example, polyimide resin. The resin 26 is preferably of characteristics such as to deform to an extent appropriate to absorbing stress, but to maintain a particular form. For example, a polyimide resin or the like may be used, and preferably one having a low Young's modulus (for example, an olef in polyimide resin, or as an example other than a polyimide resin BCB manufactured by Dow Chemical or the like). In particular, it is preferable that the Young's modulus be on the order of 300 kg/mm$^2$ or below. Alternatively, as the resin 26 may be used, for example, a silicone denatured polyimide resin, an epoxy resin, or a silicone denatured epoxy resin, or the like. By being filled with resin 26, large deformation of the bent portions 22 can be prevented, and also stress applied to the bent portions 22 can be absorbed. When the bent portions 22 become external terminals of the semiconductor device, thermal stress applied to the bent portions 22 can be absorbed by the resin 26. This effect is further enhanced when the adhesive 12 is present between the bent portions 22 and the walls of the openings 14.

On the convex surface of the bent portions 22, plating is preferably carried out. Plating may also be carried out on the reverse surface of the bent portions 22, and plating may be carried out on at least a part or all of the surface of the wiring pattern 20 facing in the direction opposite to the substrate 10. The plating may be of tin or solder or the like, but gold, which does not oxidize easily, is preferably applied. By plating with gold the use of lead can be omitted.

On the substrate 10, a protective member 28 may be adhered. The protective member 28 protects the bent portions 22, and is preferably thicker than the protrusion height of the bent portions 22 from the substrate 10. The protective member 28 is adhered to the substrate 10 in a releasable state, so as to avoid the bent portions 22. For example, the protective member 28 can be adhered to the substrate 10 with an adherent interposed. A hole is formed in the region corresponding to the bent portions 22 in the protective member 28, and the bent portions 22 can be avoided. The protective member 28 may be formed of a PET resin or polyimide resin or similar resin, or may be formed of metal or ceramic or the like. By this means, during the processes after formation of the bent portions 22, the bent portions 22 can still be protected from large deformation, and furthermore, planarity of the substrate 10 can also be maintained, as a result of which at the subsequent semiconductor chip mounting the substrate 10 can easily be mounted to be parallel and level, without the use of a special jig.

Figure 5:
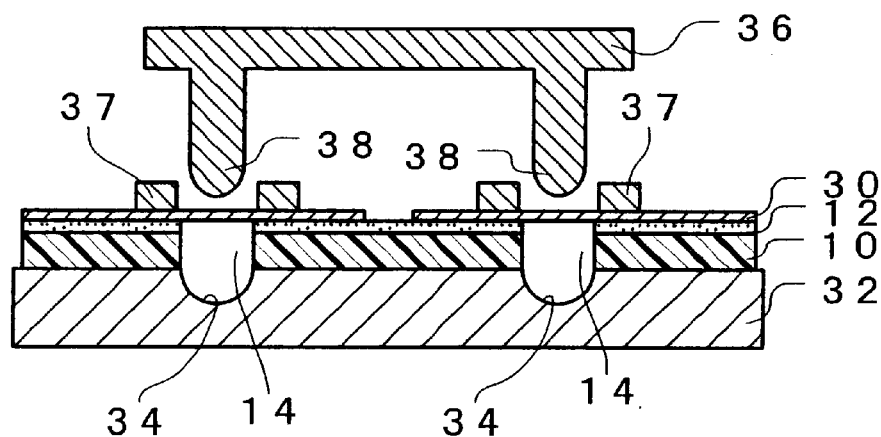
FIG. 5 shows a method of manufacturing the wiring board of the Present invention.
Figure 6:
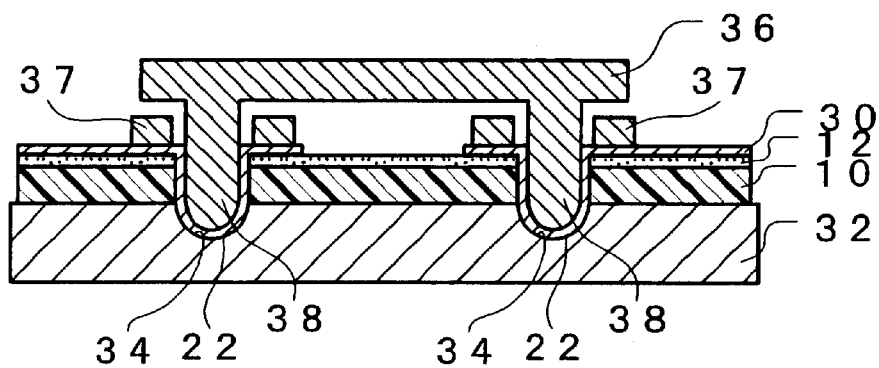
FIG. 6 shows a method of manufacturing the wiring board of the present invention.

This embodiment of the wiring board is constructed as described above, and the method of manufacture is now described. FIGS. 5 and 6 show the method of manufacturing the wiring board to which the present invention is applied.

As shown in FIG. 5, the substrate 10 is taken, on which a conductive layer 30 is provided. In the substrate 10 is formed plurality of openings 14. The conductive layer 30 may be patterned into the form of the wiring pattern 20 (see FIG. 1) by etching or the like, or may be in the form before patterning. When a conductive layer 30 before patterning is used, the conductive layer 30 is adhered over all of the openings 14. When the conductive layer 30 after patterning is used, either interconnects forming a part of the conductive layer 30 pass over the openings 14, or alternatively, land forming part of the conductive layer 30 cover the openings 14. The conductive layer 30 may be adhered to the substrate 10 with the adhesive 12 interposed, or the conductive layer 30 may be formed directly on the substrate 10 in the form of a wiring pattern and the openings 14 formed subsequently.

The above-described substrate 10, as shown in FIG. 5, is mounted on a concave die 32. The concave die 32 has formed a plurality of concavities 34 in a form corresponding to the form of the above described bent portions 22, and each of the concavities 34 is positioned in the region of formation of a bent portion 22. That is to say, the openings 14 are positioned over the concavities 34. It should be noted that the surface of the substrate 10 opposite to that on which the conductive layer 30 is formed is mounted on the concave die 32.

Facing the surface of the substrate 10 on which the conductive layer 30 is formed is disposed a convex die 36. The convex die 36 has formed a plurality of protrusions 38, corresponding to the bent portions 22 or concavities 34. The convex die 36 is disposed with the protrusions 38 facing the portions positioned over the openings 14 in the conductive layer 30. The periphery of the openings 14 in the substrate 10 are restrained with a clamp 37.

Then as shown in FIG. 6, between the concave die 32 and the convexdie 36, the conductive layer 30 is subjected to press treatment, and the bent portions 22 are formed. In more detail, the protrusions 38 of the convex die 36 press the portions positioned over the openings 14 in the conductive layer 30 to bend into the concavities 34 in the concave die 32. Basically, this is copper foil covering working, but here when a three-layer substrate, since the conductive layer 30 is able to move over the substrate 10 with the adhesive 12 interposed, the conductive layer 30 is easy to bend. Within the openings 14, a part of the adhesive 12 may be drawn in as the conductive layer 30 is bent. In this way, a part of the conductive layer 30 is pulled into the openings 14 in the substrate 10 to form the bent portions 22.

It should be noted that when a part of the conductive layer 30 is drawn into the openings 14, a fracture 24 (see FIG. 2) may occur in part of the conductive layer 30. However, even if the fracture 24 occurs, it is necessary that the electrical conduction of the conductive layer 30 be ensured. For example, the fracture 24 may occur in the portion of the conductive layer 30 forming the ends of the bent portions 22.

When the conductive layer 30 is already patterned in the form of the wiring pattern, in the above described process a wiring board can be obtained. When the conductive layer 30 is not patterned in the form of the wiring pattern, after the above described process, by patterning the conductive layer 30 in the form of a wiring pattern a wiring board can be obtained. As a method of patterning, etching can be applied, and it is preferable to apply lithography.

After the bent portions 22 are formed, if required, the concavities on the reverse surface of the bent portions 22 are filled with the resin 26 (see FIG. 1). For example, the concavities may be filled with the resin 26 being a polyimide, or epoxy, or the like solder resist or the like, by printing. After filling, when the resin is cured, in the in subsequent processes, even if for example a protective member is not applied, large deformation of the bent portions 22 can be prevented. Further, when a soft resin such as polyimide or the like is used, thermal stress between the semiconductor chip and a motherboard can be adequately absorbed. Whether before or after the formation of the bent portions 22, on the surface of the substrate 10 opposite to the surface on which the conductive layer 30 is formed, the protective member 28 shown in FIG. 1 may be adhered, in a releasable state. After the formation of the bent portions 22, plating may be carried out on the convex surface of the bent portions 22. The plating process may be carried out after the bent portions 22 are formed and after the conductive layer 30 is patterned in the form of the wiring pattern. By means of this, not only the bent portions 22, but also the whole of the wiring pattern can be subjected to plating. As plating, it is preferable to carry out gold plating.

According to this embodiment, the bent portions 22 forming a part of the conductive layer 30 can be used as external terminals of the semiconductor device or the like, and therefore, solder balls can be omitted. As a result, the processing can be carried out without expensive equipment, and damage to the package can be eliminated.

Second Embodiment

Figure 7:
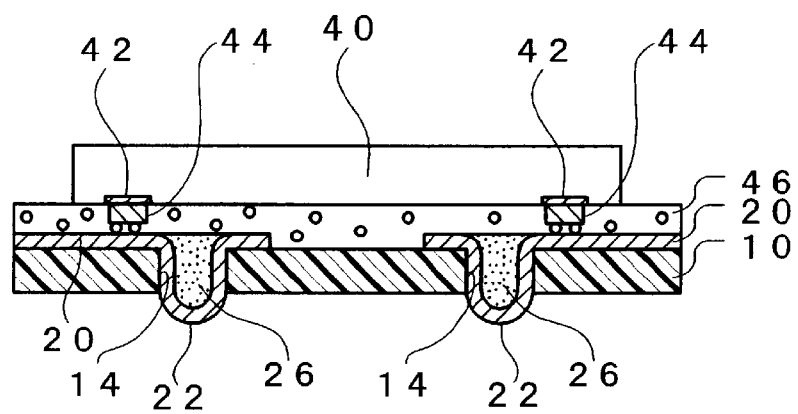
FIG. 7 shows a second embodiment of the semiconductor device of the resent invention.

FIG. 7 shows a second embodiment of the semiconductor device to which the present invention is applied. In this embodiment, the wiring board shown in FIG. 1 is used. It should be noted that in FIG. 7, the adhesive 12 (see FIG. 1) between the substrate 10 and the wiring pattern 20 is omitted. The protective member 28 shown in FIG. 1 is in FIG. 7 in the released state, but may equally remain adhered. In this embodiment, the construction described in the first embodiment can be applied, and the bent portions 22 protruding from the substrate 10 form the external terminals of the semiconductor device.

The semiconductor device shown in FIG. 7 has a semiconductor chip 40 mounted on a substrate 10 on which a wiring pattern 20 is formed. In the region of the substrate 10 in which the semiconductor chip 40 is mounted, bent portions 22 are positioned as external terminals. That is to say, this semiconductor device is a fan-in type semiconductor device. For this reason, in the region of the substrate 10 in which the semiconductor chip 40 is mounted, openings 14 are formed.

On one surface of the semiconductor chip 40, a plurality of electrodes 42 is formed of aluminum or the like. When the semiconductor chip 40 has a rectangular form, the electrodes 42 may be aligned along two parallel edges, or may be aligned along four edges, or may equally be aligned in a central portion of the semiconductor chip 40 or close thereto. Avoiding the electrodes 42, on the active surface a passivation film may be formed. On the electrodes 42, bumps 44 are preferably provided. For the bumps 44, Au, Ni—Au, In, Au—Sn, or the like is commonly used, but solder balls may also be used, or protrusions of conductive resin. Alternatively, the bumps may be provided by making the electrodes 42 protrude. In place of the bumps 44, or in addition to the bumps 44 bumps may also be formed on the wiring pattern 20.

The semiconductor chip 40 is mounted on the surface of the substrate 10 on which the wiring pattern 20 is formed, and for example, face-up mounting or face-down mounting can be applied. When face-down mounting is applied, an anisotropic conductive material 46 can be used. The anisotropic conductive material 46 has conductive particles dispersed in an adhesive, and may be an anisotropic conductive film. Between the surface of the semiconductor chip 40 on which the electrodes 42 are formed and the surface of the substrate 10 on which the wiring pattern 20 is formed is interposed the anisotropic conductive material 46. Between the bumps 44 of the semiconductor chip 40 and the wiring pattern 20, electrical conduction is provided by the conductive particles of the anisotropic conductive material 46.

In place of the anisotropic conductive material 46, an insulating resin may be used which contracts on curing by light or heat or the like, to mechanically press the bumps 44 in contact with the wiring pattern 20.

When the anisotropic conductive material 46 is provided to cover the whole of the wiring pattern 20, then the anisotropic conductive material 46 forms a protective film for the wiring pattern 20. Alternatively, the anisotropic conductive material 46 may be provided only in the region of mounting of the semiconductor chip 40. In this case, a resist such as a photoresist or solder resist or the like may be formed on the surface of the substrate 10 on which the wiring pattern 20 is formed, outside the region of mounting of the semiconductor chip 40. That is to say, the resist covers the part of the wiring pattern 20 not covered by the semiconductor chip 40 and thus exposed.

In this embodiment, the surface opposite to the protruding surface of the bent portions 22 is filled with the resin 26, and large deformation of the bent portions 22 is prevented. When the anisotropic conductive material 46 is a stress-absorbing material, the resin 26 may be the anisotropic conductive material 46 with which the bent portions 22 are filled when mounting the semiconductor chip. In this case, as described above, when bonding the semiconductor chip 40 to the substrate 10, large deformation of the bent portions 22 is prevented, and without using a special jig, the planarity of the wiring board is easily assured, and therefore it is preferable for the protective member 28 to be adhered to the substrate 10 before the bonding process.

This embodiment is constructed as described above, and the method of manufacture thereof is now described. First, the wiring board described in the first embodiment is taken, and then the semiconductor chip 40 is mounted on the substrate 10. It should be noted that immediately before mounting the semiconductor chip 40 on the substrate 10, the above described protrusions may be formed, to complete the wiring board.

For mounting the semiconductor chip 40, the anisotropic conductive material 46 can be used. For example, the anisotropic conductive material 46 is provided on at least one of the surface of the substrate 10 on which the wiring pattern 20 is formed, and the surface of the semiconductor chip 40 on which the electrodes 42 or bumps 44 are formed. When the anisotropic conductive material 46 is an anisotropic conductive film, this is adhered. Next, pressure is applied to at least one of the semiconductor chip 40 and substrate 10, and the two are adhered together, while the wiring pattern 20 and electrodes 42 are electrically connected.

Since on the wiring board the bent portions 22 are already provided as external terminals, by the above described process the semiconductor device shown in FIG. 7 can be obtained.

When the semiconductor chip is mounted face-up, the electrodes of the semiconductor chip and the wiring pattern are commonly connected by wire bonding, and thereafter the mounting portion of the semiconductor chip covered with resin. When face-down mounting is carried out, in addition to bonding with the above-described anisotropic conductive film, other methods include using a conductive resin paste, metal bonding by Au—Au, Au—Sn, solder or the like, or using the contraction force of an insulating resin or the like, and any of these methods may be used. The same applies to the following embodiments.

Third Embodiment

Figure 8:
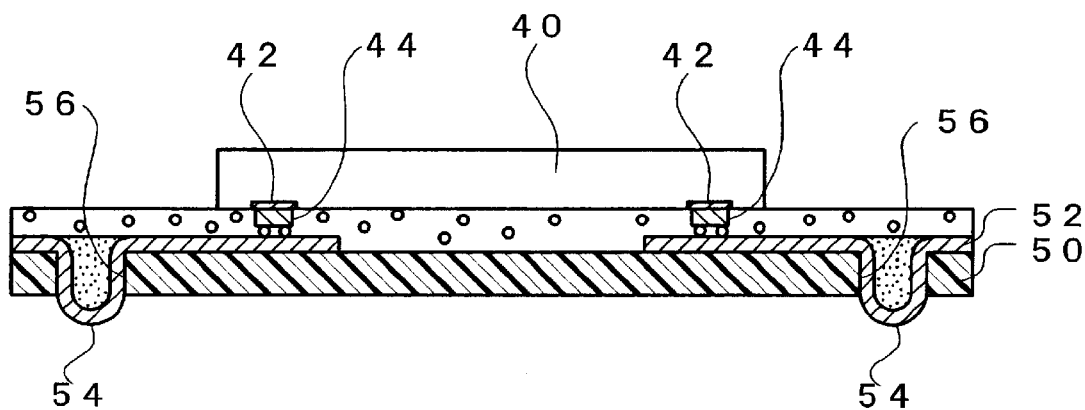
FIG. 8 hows a third embodiment of the semiconductor device of the present invention.

FIG. 8 shows a third embodiment of the semiconductor device to which the present invention is applied. In this embodiment, the semiconductor chip 40 described in the second embodiment is used, and bent portions 54 are formed outside the region of mounting of the semiconductor chip 40. That is to say, this embodiment of the semiconductor device is a fan-out type of semiconductor device. Therefore, openings 56 are formed outside the region of a substrate 50 in which the semiconductor chip 40 is mounted. In other respects, the construction and method of manufacture described in the second embodiment can be applied.

Fourth Embodiment

Figure 9:
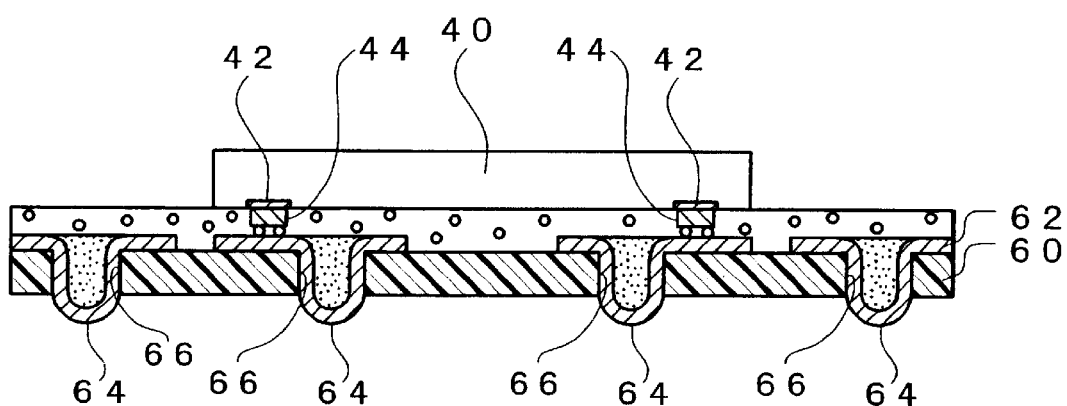
FIG. 9 shows a fourth embodiment of the semiconductor device of the present invention.

FIG. 9 shows a fourth embodiment of the semiconductor device to which the present invention is applied. In this embodiment, the semiconductor chip 40 described in the second embodiment is used, and bent portions 64 are formed both inside and outside the region of mounting of the semiconductor chip 40. That is to say, this embodiment of the semiconductor device is a fan-in/out type of semiconductor device. Therefore, openings 66 are formed both inside and outside the region of a substrate 60 in which the semiconductor chip 40 is mounted. To ensure the planarity of the outside of the region of mounting of the semiconductor chip 40, and improve the secondary mountability on the motherboard, the construction may have a stiffener plate (not shown in the drawings) adhered in this region. In other respects, the construction and method of manufacture described in the second embodiment can be applied.

Fifth Embodiment

Figure 10:
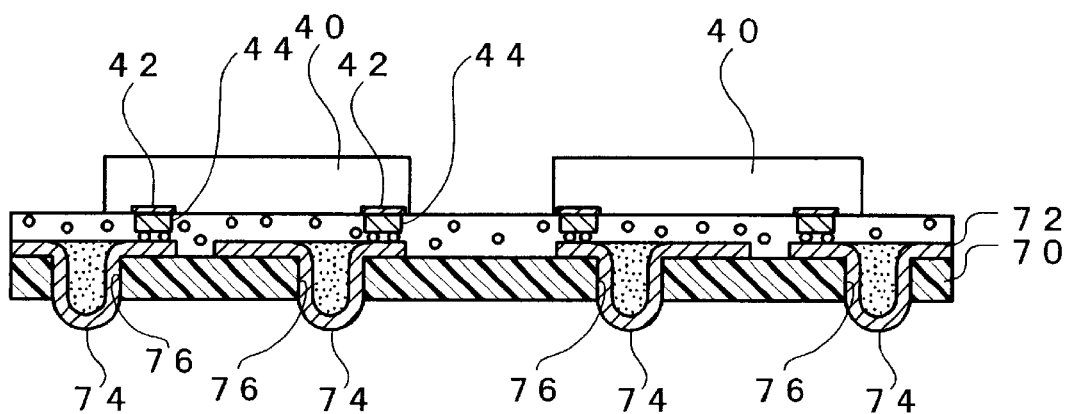
FIG. 10 shows a fifth embodiment of the semiconductor device of the present invention.

FIG. 10 shows a fifth embodiment of the semiconductor device to which the present invention is applied. In this embodiment, a plurality of semiconductor chips 40 is used, and as each of the semiconductor chips 40 can be used that described in the second embodiment, whether semiconductor chips 40 of the same size are used, or a plurality of semiconductor chips 40 of different sizes. To this semiconductor device is applied a multi-chip package. In this embodiment, bent portions 74 may be provided inside the region of mounting of each of the semiconductor chips 40, or may be provided outside the mounting region, or may be provided in both places. That is to say, the openings. 76 are formed in at least one of inside and outside the mounting region of the semiconductor chips 40 on the substrate 70. The bent portions 74 may be provided in the region between the plurality of semiconductor chips 40, or may be provided to avoid this region. That is to say, the openings 76 may be formed in the region of the substrate 70 between the plurality of semiconductor chips 40, or the openings 76 may be formed to avoid this region. In other respects, the construction and method of manufacture described in the second embodiment can be applied.

Sixth Embodiment

Figure 11:
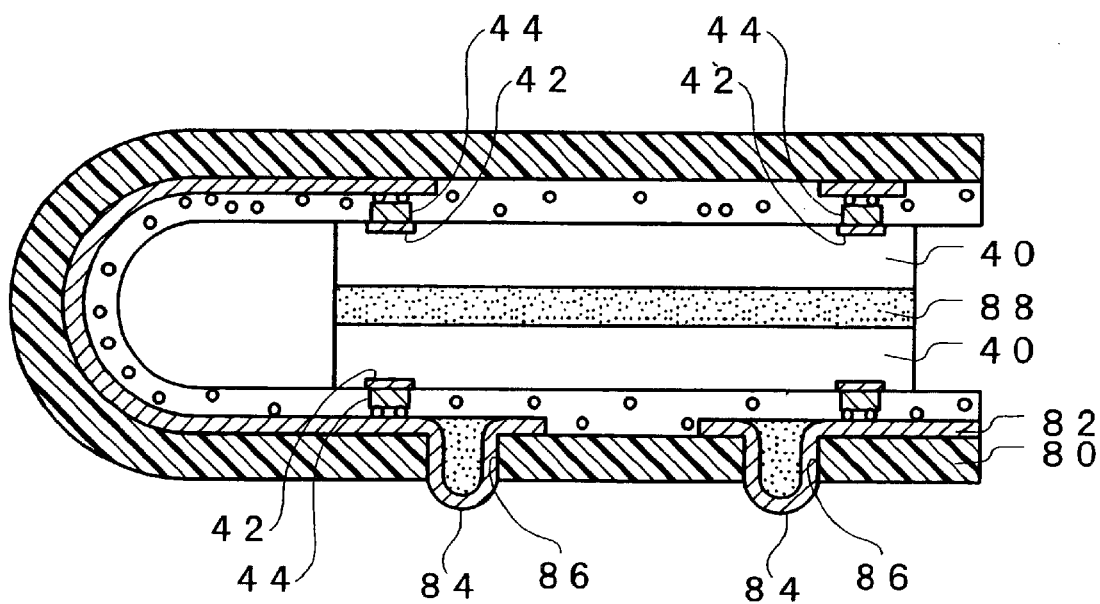
FIG. 11 shows a sixth embodiment of the semiconductor device of the present invention.

FIG. 11 shows a sixth embodiment of the semiconductor device to which the present invention is applied. In this embodiment, a plurality of semiconductor chips 40 is used, and as each of the semiconductor chips 40 can be used that described in the second embodiment, whether semiconductor chips 40 of the same size are used, or a plurality of semiconductor chips 40 of different sizes. To this semiconductor device is applied a multi-chip package. In this embodiment, a part of a substrate 80 is bent, and a plurality of semiconductor chips 40 are stacked. In FIG. 11, a two-chip example is shown, but the substrate may be further similarly folded, and a larger number of semiconductor chips stacked.

The substrate 80 is formed of a flexible material, and particularly a flexible substrate or in the case where it is necessary to further increase the interconnect density a built-up type of flexible substrate is preferable. The substrate 80 is oblong, longer in one direction. At both ends of the long direction of the substrate 80 a plurality of semiconductor chips 40 is mounted.

In this embodiment, the surface of the substrate 80 on which the semiconductor chips are mounted is folded inward, and the region of the substrate 80 between the plurality of semiconductor chips 40 is bent. It should be noted that in the drawing, the substrate 80 is folded without a crease, but the substrate 80 may equally be creased. In the substrate 80, in the region of bending, at least one or a plurality of holes may be formed. By this means, the resilience of the substrate 80 is reduced, and it becomes easier to bend, and also easier to maintain in the bent state. It should be noted that it is preferable that a wiring pattern 82 is formed to avoid the holes, but the wiring pattern 82 may be formed over the holes.

The substrate 80 is bent, and the surfaces of the plurality of semiconductor chips 40 opposite to the surfaces on which the electrodes 42 are formed are adhered together, with an adhesive 88 interposed. By means of the adhesive force of the adhesive 88, the substrate 80 is maintained in the bent state. Since the surfaces of the plurality of semiconductor chips 40 are each flat, they are easily adhered. When the adhesive 88 is a conductive adhesive, then the adhesion surfaces by which the plurality of semiconductor chips 40 are adhered can be made to be at the same electrical potential. When the adhesive 88 is a thermally conductive adhesive, then heat can be transferred between the plurality of semiconductor chips 40. For example, when of the plurality of semiconductor chips 40 one has a greater heat emission and the other has a lesser heat emission, then as heat can be transferred from the one to the other, cooling is possible. The adhesive 88 may be a (pressure sensitive, or tacky) adherent. The adhesive 88 in sheet form or liquid form may be adhered to the reverse surface of each of the plurality of semiconductor chips 40 while the substrate 80 is still in the flat form, and thereafter the reverse surfaces of both semiconductor chips 40 adhered together. Alternatively, the reverse surfaces of the semiconductor chips 40 may be positioned together and then filled with the adhesive 88 in liquid form.

In this embodiment, two semiconductor chips 40 are used, but a plurality of semiconductor chips 40 in excess of two may equally be used. In this case, to the surface of one semiconductor chip 40 opposite to the surface on which the electrodes 42 are formed may be adhered to the surface of at least one of the remainder of the plurality of semiconductor chips 40 opposite to the surface on which the electrodes 42 are formed. By means of such a formation, a plurality, and particularly a large number of semiconductor chips 40 can be stacked in a confined area.

In this embodiment, in a part of the bent substrate 80, bent portions 84 are provided on a flat portion. That is to say, in a portion of the substrate 80 avoiding the bent portion, openings 86 are formed. The bent portions 84 may be provided inside the region of mounting of the semiconductor chips 40, or may be provided outside the mounting region, or may be provided in both places. That is to say, the openings 86 are formed in at least one of inside and outside the mounting region of the semiconductor chips 40 on the substrate 80. The bent portions 84 may be provided in the region between the plurality of semiconductor chips 40, or may be provided to avoid this region. That is to say, the openings 86 may be formed in the region of the substrate 80 between the plurality of semiconductor chips 40, or the openings 86 may be formed to avoid this region.

When a plurality of semiconductor chips 40 of different sizes are used, when the larger semiconductor chip 40 is disposed on the side of the substrate 80 on which the external terminals (bent portions 84) are formed, then this will be geometrically stable.

In other respects, the construction and method of manufacture described in the second embodiment can be applied. In this embodiment of the semiconductor device the plurality of semiconductor chips 40 is laminated, and therefore even more compactness than in the above described fifth embodiment is achieved.

It should be noted that the mounting of a plurality of semiconductor chips on the substrate can equally be applied to other embodiments.

Seventh Embodiment

Figure 12:
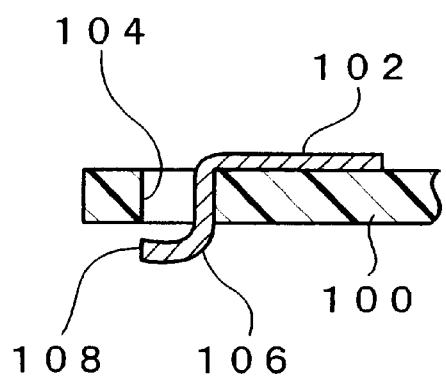
FIG. 12 shows a seventh embodiment of the wiring board of the present invention.

FIG. 12 shows a seventh embodiment of the wiring board to which the present invention is applied. This embodiment of the wiring board comprises a substrate 100 and wiring pattern 102. In the substrate 100, a plurality of openings 104 is formed. The wiring pattern 102 is formed on one surface of the substrate 100, and a part thereof intrudes into an opening 104. A part of the wiring pattern 102 is bent on the inside of the opening 104, forming a bent portion 106. An end 108 of the bent portion 106 is terminated to avoid the surface of the substrate 100. For example, the bent portion 106 may protrude from the opening 104 to form a protrusion, or alternatively, need not protrude from the opposite surface of the substrate 100. The end 108 of the bent portion 106 may contact the inner wall of the opening 104 to be supported.

In this embodiment of the wiring board, unless there are particular circumstances, the content of the above described embodiments can be applied.

In this embodiment of the wiring board a semiconductor device can be fabricated with at least one semiconductor chip mounted. A semiconductor device using this embodiment of the wiring board may be a fan-in type having the bent portions 106 forming the external terminals inside the region of the substrate 100 on which the semiconductor chip is mounted, or may be a fan-out type having the bent portions 106 forming the external terminals outside the mounting region of the semiconductor chip, or again may be a fan-in/out type having the bent portions 106 forming the external terminals both inside and outside the mounting region of the semiconductor chip. In this embodiment of the wiring board, a plurality of semiconductor chips may be mounted.

Eighth Embodiment

Figure 13:
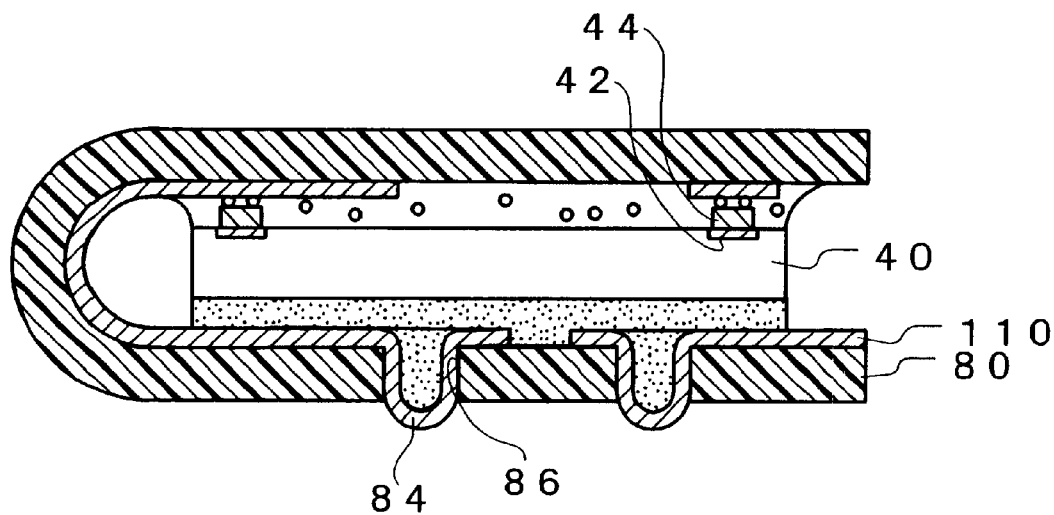
FIG. 13 shows an eighth embodiment of the semiconductor device of the present invention.

FIG. 13 shows an eighth embodiment of the semiconductor device to which the present invention is applied. This embodiment of the semiconductor device differs from the semiconductor device (sixth embodiment) shown in FIG. 11 in that the plurality of semiconductor chips 40 are not stacked. In other respects, the content described in the sixth embodiment can, unless there are particular circumstances, be applied to this embodiment.

That is to say, in FIG. 13, except in the regions of the substrate 80 where the bent portions 84 are formed, the semiconductor chip 40 is mounted. Therefore, stress generated by differences in the coefficient of thermal expansion between the semiconductor chip 40 and the substrate 80 is not transferred to the bent portions 84. The substrate 80 is bent, and the surface (upper surface) of the semiconductor chip 40 opposite to that of mounting on the substrate 80 is adhered to the substrate 80 with an adhesive 110 interposed. For example, the upper surface of the semiconductor chip 40 is adhered to the region of the substrate 80 in which the bent portions 84 are formed. By means of this, a compact semiconductor device can be obtained.

It should be noted that the bending of a portion of the substrate as in this embodiment can equally be applied to other embodiments.

Ninth Embodiment

Figure 14:
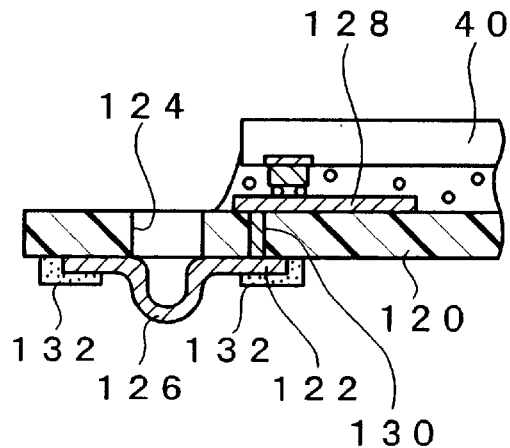
FIG. 14 shows a ninth embodiment of the semiconductor device of the resent invention.

FIG. 14 shows a ninth embodiment of the semiconductor device to which the present invention is applied. The wiring board used in this embodiment comprises a substrate 120, and a (first) wiring pattern 122 formed on one surface of the substrate 120. In the substrate,120 a plurality of openings 124 are formed. A part of the wiring pattern 122 forms a bent portion 126 protruding over the opening 124, in the direction away from the substrate 120.

On the other surface of the substrate 120, another (second) wiring pattern 128 may be formed. The first wiring pattern 122 and the second wiring pattern 128 are electrically connected by means of a through hole 130 or the like formed in the substrate 120.

On the other surface of the substrate 120 a semiconductor chip 40 is mounted. For example, the semiconductor chip 40 and second wiring pattern 128 are electrically connected using face-down bonding. On the wiring pattern 122 formed on one surface of the substrate 120, avoiding the bent portion 126, a protective film 132 of solder resist or the like is preferably provided.

According to this embodiment, the bent portion 126 constituting a part of the wiring pattern 122 formed on one surface of the substrate 120 forms external terminals. The bent portion 126 is electrically connected to the semiconductor chip 40 through the first wiring pattern 122, through hole 130, and second wiring pattern 128.

The method of manufacturing the wiring board used in this embodiment comprises a process of inserting a convex die into the openings 124 in the substrate 120, and bending a part of the metal foil forming the wiring pattern 122 to form bent portions 126. In more detail, the convex die is inserted into the openings 124 from the surface opposite to the surface on which the conductive layer (wiring pattern 122) is formed, bending a part of the conductive layer (wiring pattern 122) to protrude in the direction away from the substrate 120, and forming bent portions 126.

Then the method of manufacturing this embodiment of the semiconductor device includes a process of mounting the semiconductor chip 40 on the above described wiring board.

In respects other than as described above, unless there are particular circumstances, the content described in other embodiments can be applied to this embodiment.

Tenth Embodiment

Figure 15:
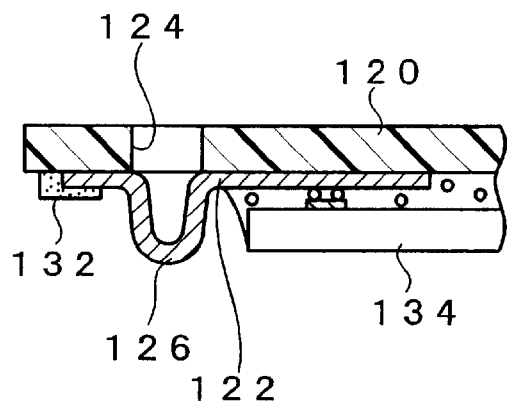
FIG. 15 shows a tenth embodiment of the semiconductor device of the present invention.

FIG. 15 shows a tenth embodiment of the semiconductor device to which the present invention is applied. This embodiment of the semiconductor device has a semiconductor chip 134 mounted on bent portions 126 of the substrate 120. In more detail, the wiring pattern 122 is formed on one surface of the substrate 120, the semiconductor chip 134 is mounted on the surface on which the wiring pattern 122 is formed, and the semiconductor chip 134 and wiring pattern 122 are electrically connected. Therefore, in the substrate 120, the surface of mounting the semiconductor chip 134 and the surface on which the bent portions 126 forming external terminals protrude are the same. In this case, to ensure functioning as external terminals, the protrusion height of the bent portions 126 is preferably such as to go beyond the semiconductor chip 134. For this purpose, bent portions 126 are formed higher, or a thin type of semiconductor chip 134 is used.

In respects other than as described above, the content described in the ninth embodiment can, unless there are particular circumstances, be applied to this embodiment.

Eleventh Embodiment

Figure 16:
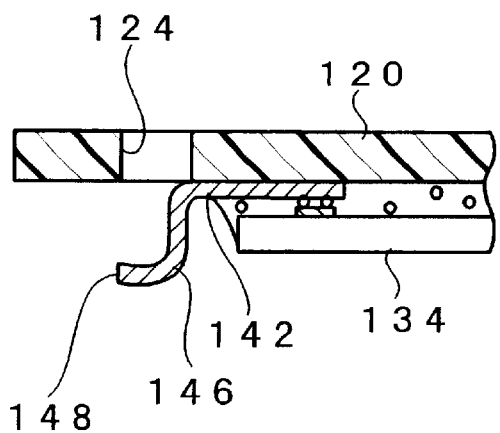
FIG. 16 shows an eleventh embodiment of the semiconductor device of the resent invention.

FIG. 16 shows an eleventh embodiment of the semiconductor device to which the present invention is applied. This embodiment of the semiconductor device differs from the tenth embodiment in bent portions 146, and in other respects the content described in the tenth embodiment can, unless there are particular circumstances, be applied to this embodiment.

In FIG. 16, on one surface of the substrate 120 a wiring pattern 142 is formed, and over the opening 124, a portion is bent to form a bent portion 146. An end 148 of the bent portion 146 is terminated to avoid the surface of the substrate 120. For example, the end 148 of the bent portion 146 may be terminated above the opening 124, or alternatively, may contact the inner wall of the opening 124 to be supported.

Twelfth Embodiment

Figure 17:
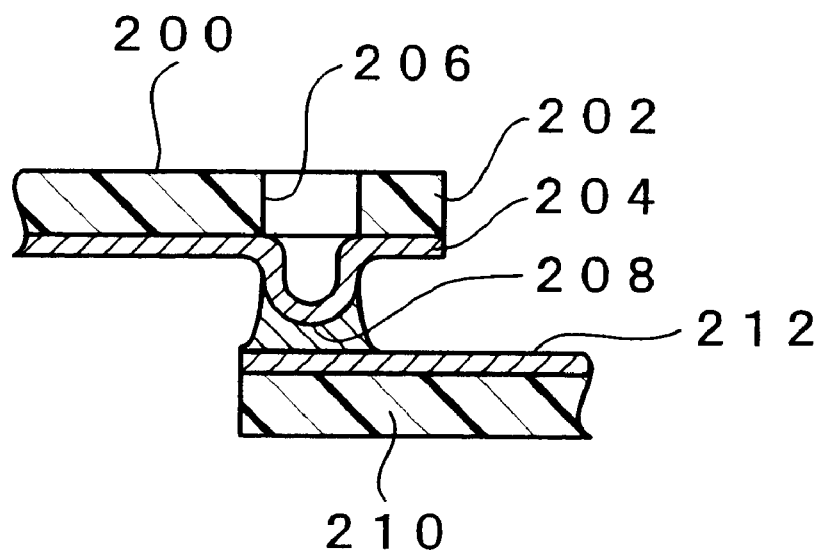
FIG. 17 shows a twelfth embodiment of the connected board of the present invention.

FIG. 17 shows a twelfth embodiment of the connected board to which the present invention is applied. As shown in FIG. 17, this embodiment of the connected board 200 may be electrically connected to a conventional wiring board constituted by a wiring pattern 212 formed on a substrate 210. It should be noted that as a semiconductor device structural element the wiring board 210 may be an interposer for mounting the semiconductor chip.

The connected board 200 has a substrate 202, and a wiring pattern 204 formed on one surface of the substrate 202. In the substrate 202, an opening 206 is formed, and from the surface of the substrate 202 on which the wiring pattern 204 is formed over the opening 206, a part of the wiring pattern 204 protrudes and is bent, to form a bent portion 208.

The connected board 200 is electrically connected to the wiring pattern 212 of the substrate 202, with the bent portion 208 interposed. For the electrical connection between the two, a conductive member may be used, and a method of applying ultrasound or heat or the like to diffuse the material can be applied. As the conductive member, solder, anisotropic conductive film, anisotropic conductive adhesive, conductive paste or conductive adhesive or the like can be used. As the modality of electrical connection using a conductive member may be cited as an example brazing such as soldering or the like.

According to this embodiment, utilizing the height of the bent portion 208, the occurrence of a short-circuit between the wiring pattern 204 of the connected board 200 and the wiring pattern 212 of the substrate 210 can be prevented.

It should be noted that any of the wiring boards described in the above described embodiments can be connected to another wiring board, as in this embodiment.

Thirteenth Embodiment

Figure 18:
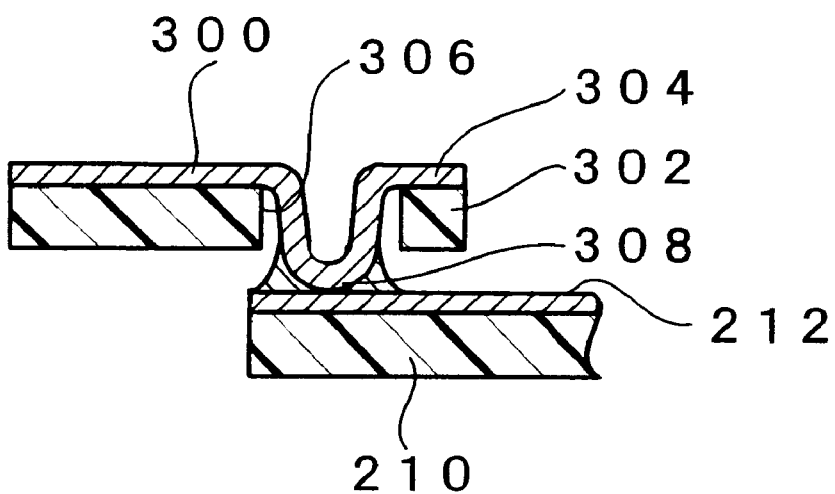
FIG. 18 shows a thirteenth embodiment of the connected board of the present invention.

FIG. 18 shows a thirteenth embodiment of the connected board to which the present invention is applied. As shown in FIG. 18, this embodiment of the connected board 300 may be electrically connected to a conventional wiring board constituted by a wiring pattern 212 formed on a substrate 210. It should be noted that as a semiconductor device structural element the substrate 210 may be an interposer for mounting the semiconductor chip.

The connected board 300 has a substrate 302, and a wiring pattern 304 formed on one surface of the substrate 302. In the substrate 302, an opening 306 is formed, and a part of the wiring pattern 304 is bent and intrudes within the opening 306. Then facing in the direction of the opposite surface of the substrate 302 from the surface of formation of the wiring pattern 304, a protruding bent portion 308 is formed.

In this embodiment, a gap is formed between the internal walls of the opening 306 and the bent portion 308, and this is such that the two at least partially do not touch. According to this construction, the bent portion 308 is able to move within the opening 306. Therefore, stress applied to the bent portion 308 can be effectively absorbed. This aspect can equally be applied to the other embodiments.

Figure 19:
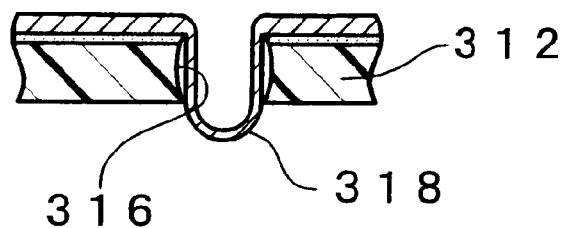
FIG. 19 shows a modification embodiment of the present invention.

As shown in FIG. 19, an opening 316 has a larger diameter at the center of the thickness of a substrate 312, and at the opening extremities has a smaller diameter. By means of this, at the center of the thickness of the substrate 312, a bent portion 318 deforms, and stress can be absorbed. This can also be applied to the other embodiments.

The connected board 300 is electrically connected to the wiring pattern 212 of the substrate 202 with the bent portion 308 interposed. For the electrical connection between the two, solder, anisotropic conductive film, anisotropic conductive adhesive or conductive paste or the like can be used, or metal bonding by means of ultrasound or heat or the like may be applied.

According to this embodiment, utilizing the height of the bent portion 308, the occurrence of a short-circuit between the wiring pattern 304 of the connected board 300 and the wiring pattern 212 of the substrate 210 can be prevented.

It should be noted that any of the wiring boards described in the above described embodiments can also be connected to a substrate as in this embodiment.

Fourteenth Embodiment

Figure 20:
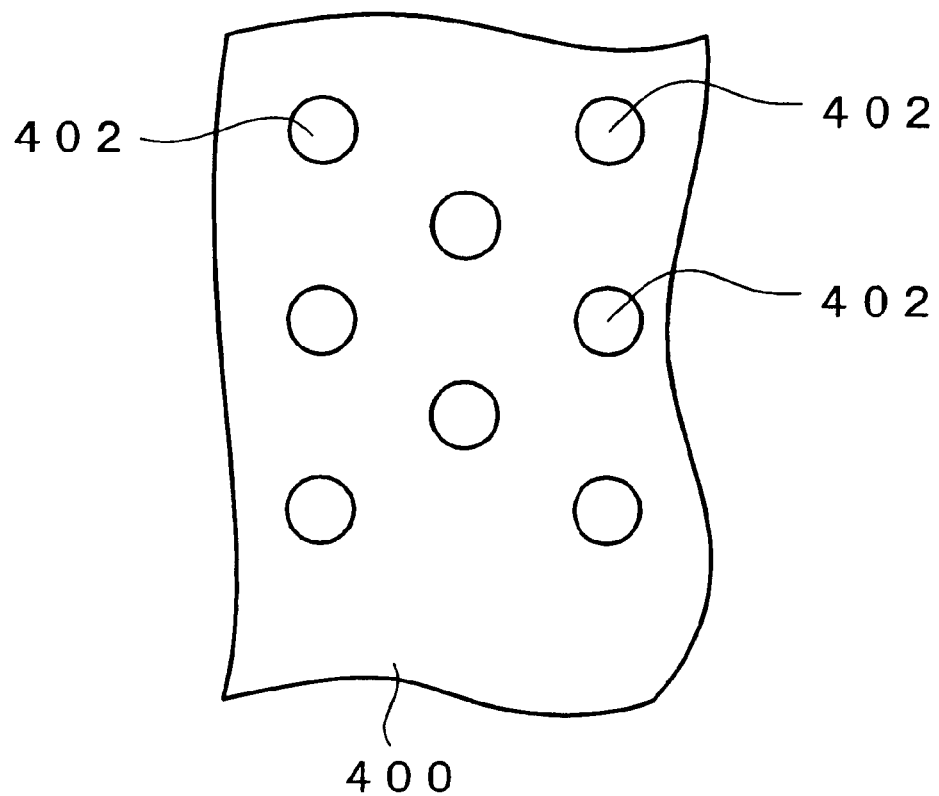
FIG. 20 shows a fourteenth embodiment of the wiring board of the present invention.

FIG. 20 shows a fourteenth embodiment of the wiring board to which the present invention is applied. As shown in FIG. 20, a wiring board 400 of the present invention may have bent portions 402 disposed in a zigzag pattern. By means of this, the pitch of the bent portions 402 can be made larger, and a plurality (a large number) of elements of a wiring pattern can be formed between the bent portions 402.

It should be noted that any of the wiring boards described in the above described embodiments can have bent portions disposed in a zigzag pattern as in this embodiment.

Fifteenth Embodiment

Figure 21:
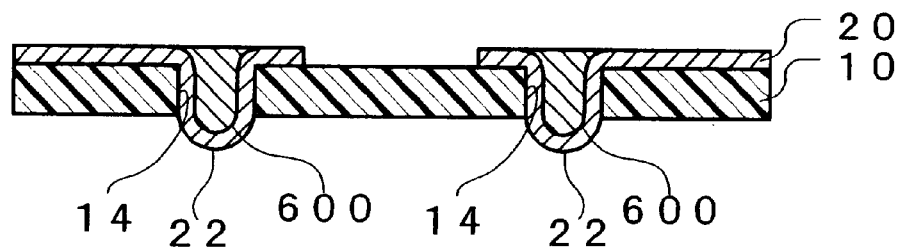
FIG. 21 shows a fifteenth embodiment of the wiring board of the present invention.

FIG. 21 shows a fifteenth embodiment of the wiring board to which the present invention is applied. This embodiment of the wiring board employs a wiring board described with reference to FIG. 1. Then on the concave side of the bent portions 22, a conductive substance 600 is provided.

In more detail, the interior of the bent portions 22 is filled with the conductive substance 600. The conductive substance 600 is, for example, conductive paste, brazing material such as solder or the like, or a metal or the like formed by plating. It should be noted that when the conductive substance 600 is stress-absorbing, this is more desirable. With respect to stress absorption, the description in the first embodiment of the resin 26 applies.

By means of this, the concave side of the bent portions 22 can also be used, with the conductive substance 600 interposed, as an electrical connection region. With respect to the inner surf ace of the bent portions 22, with the conductive substance 600 interposed, electrical connection can be achieved.

To this embodiment, the content of the above described embodiments can be applied. The content described in this embodiment can be applied to the following embodiments.

Sixteenth Embodiment

Figure 22:
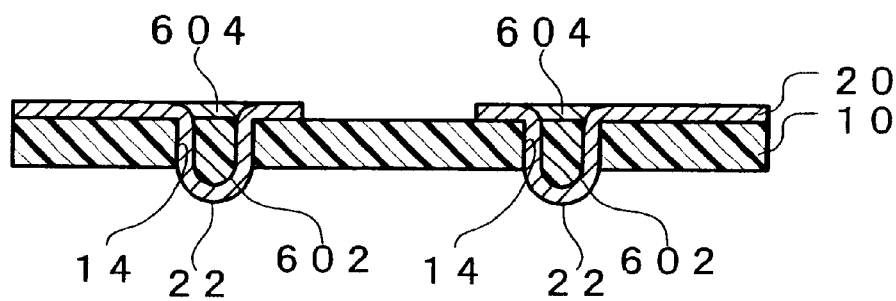
FIG. 22 shows a sixteenth embodiment of the wiring board of the present invention.

FIG. 22 shows a sixteenth embodiment of the wiring board to which the present invention is applied. This embodiment of the wiring board employs a wiring board described with reference to FIG. 1. Then on the concave side of the bent portions 22, a conductive substance 604 is provided. In more detail, an inside of the bent portions 22 is filled with an insulating resin 602, and the conductive substance 604 is provided from over the insulating resin 602 as far as the wiring pattern 20.

By means of this, electrical connection can also be achieved between the concave side of the bent portions 22 over the insulating resin 602 and the wiring pattern 20 with the conductive substance 604 interposed.

Seventeenth Embodiment

Figure 23:
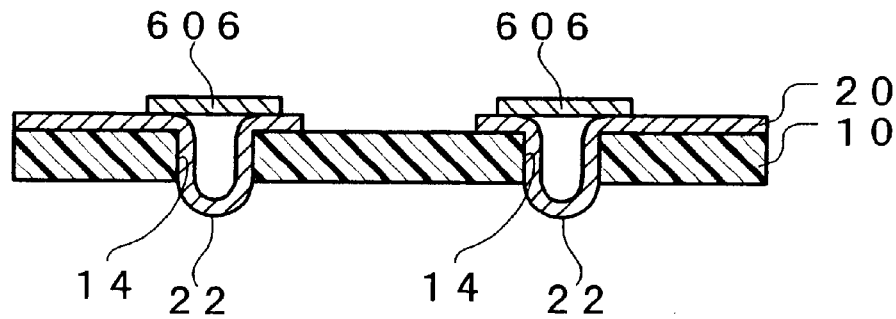
FIG. 23 shows a seventeenth embodiment of the wiring board of the present invention.

FIG. 23 shows a seventeenth embodiment of the wiring board to which the present invention is applied. This embodiment of the wiring board employs a wiring board described with reference to FIG. 1. Then on the concave side of the bent portions 22, a conductive substance 606 is provided. In more detail, leaving the inside of the bent portions 22 hollow, the conductive substance 606 is provided from over the concavity to reach as far as the wiring pattern 20.

By means of this, electrical connection can also be achieved between the concave side of the bent portions 22 and the wiring pattern 20 with the conductive substance 606 interposed. Since the concave side of the bent portions 22 is hollow, the bent portions 22 are easily deformed, and stress can be absorbed.

Eighteenth Embodiment

Figure 24:
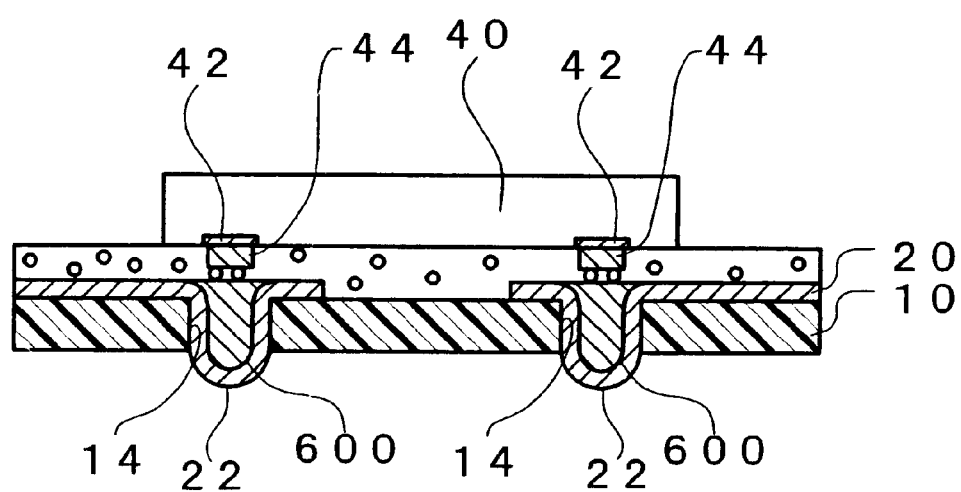
FIG. 24 shows an eighteenth embodiment of the semiconductor device of the present invention.

FIG. 24 shows an eighteenth embodiment of the semiconductor device to which the present invention is applied. This semiconductor device comprises the wiring board shown in FIG. 21, and a semiconductor chip 40 mounted on this wiring board. The semiconductor chip 40 is that described with reference to FIG. 7. The electrodes 42 (bumps 44) of the semiconductor chip 40 are bonded over the conductive substance 600 provided on the concave side of the bent portions 22 of the wiring board.

It should be noted that as a modification of this embodiment, using the wiring board shown in FIG. 22 or FIG. 23, the electrodes 42 (bumps 44) may be bonded over the conductive a substances 604 and 606. In other respects, the construction described with reference to FIG. 7 applies.

Nineteenth Embodiment

Figure 25:
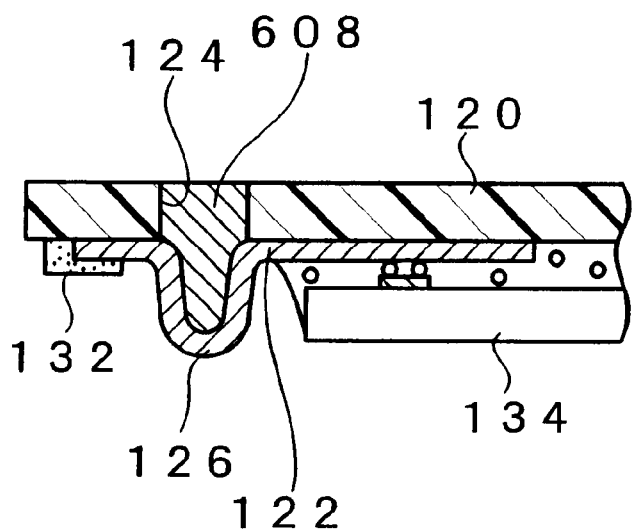
FIG. 25 shows a nineteenth embodiment of the semiconductor device of the present invention.

FIG. 25 shows a nineteenth embodiment of the semiconductor device to which the present invention is applied.

This embodiment of the wiring board includes the wiring board shown in FIG. 15. That is to say, this wiring board has a substrate 120 in which openings 124 are formed and a wiring pattern 122 formed on one surface of the substrate 120. The wiring pattern 122 has bent portions 126 protruding and being bent from one surface of the substrate 120 over the openings 124. Then within the openings 124 and bent portions 126 is filled with a conductive substance 608. By means of this, the concave side of the bent portions 126 can also be used as an electrical connection region, with the conductive substance 608 interposed.

This embodiment of the semiconductor device has the above described wiring board and a semiconductor chip 134 mounted on the substrate 120. In more detail, the content described with reference to FIG. 15 applies. Alternatively, electrodes (bumps) of the semiconductor chip 134 may be bonded to the concave side of the bent portions 126, with the conductive substance 608 interposed.

Twentieth Embodiment

Figure 26:
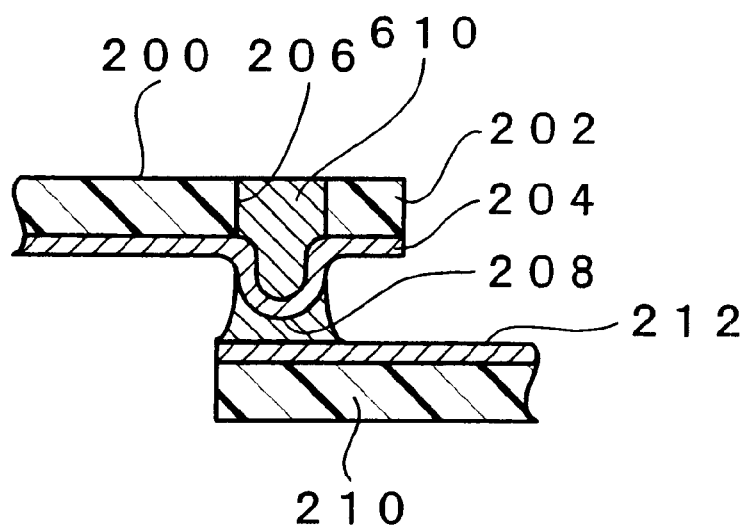
FIG. 26 shows a twentieth embodiment of the connected board of the presents invention.

FIG. 26 shows a twentieth embodiment of the connected board to which the present invention is applied.

This embodiment of the connected board comprises the connected board shown in FIG. 17. That is to say, this connected board includes a plurality of wiring boards, having wiring patterns 204 and 212 formed on substrates 202 and 210. In one wiring board, an opening 206 is formed in the substrate 202, and a bent portion 208 is formed in the wiring pattern 204. The bent portion 208 is formed to protrude over the opening 206. The opening 206 and the bent portion 208 are arranged to overlap each other. Then a conductive substance 610 is provided on the concave side of the bent portion 206. In more detail, the inside of the bent portion 206 is filled with the conductive substance 610.

Other aspects of the construction are the same as the connected board shown in FIG. 17, and therefore description is omitted. According to this embodiment, in addition to the content described with reference to FIG. 17, the concave side of the bent portion 208 can also be used as an electrical connection region, with the conductive substance 610 interposed. In more detail, electrical connection with the inner surface of the bent portion 206 can be achieved with the conductive substance 610 interposed.

Twenty-First Embodiment

Figure 27:
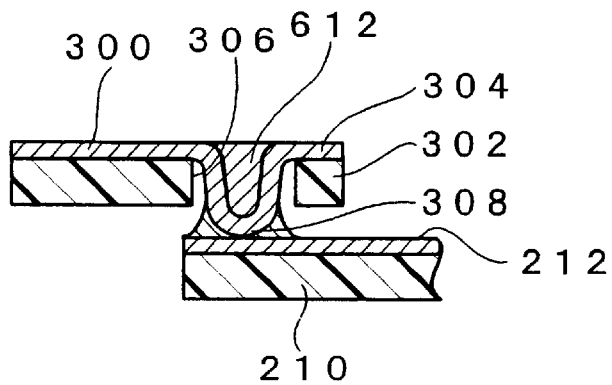
FIG. 27 shows a twenty-first embodiment of the connected board of the present invention.

FIG. 27 shows a twenty-first embodiment of the connected board to which the present invention is applied.

This embodiment of the connected board comprises the connected board shown in FIG. 18. That is to say, this connected board includes a plurality of wiring boards, having wiring patterns 304 and 212 formed on substrates 302 and 210. In one wiring board, an opening 306 is formed in the substrate 302, and a bent portion 308 is formed in the wiring pattern 304. The opening 306 and the bent portion 308 are arranged to overlap each other, and a wiring pattern 304 is formed on one surface of the substrate 302. Then on the concave side of the bent portion 308 a conductive substance 612 is provided. In more detail, the inside of the bent portion 308 is filled with the conductive substance 612.

Other aspects of the construction are the same as the connected board shown in FIG. 18, and therefore description is omitted. According to this embodiment, in addition to the content described with reference to FIG. 18, the concave side of the bent portion 308 can also be used as an electrical connection region, with the conductive substance 612 interposed. In more detail, electrical connection with the inner surface of the bent portion 308 can be achieved, with the conductive substance 612 interposed.

Twenty-Second Embodiment

Figure 28:
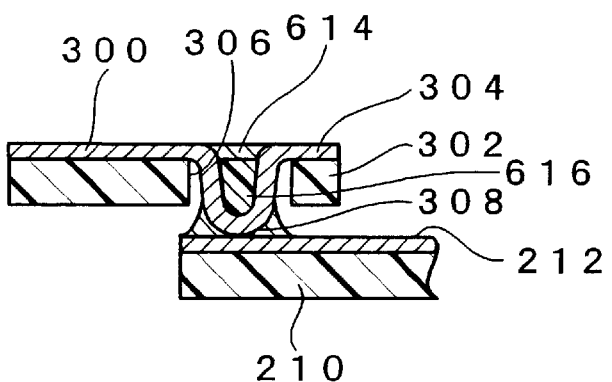
FIG. 28 shows a twenty-second embodiment of the connected board of the present invention.

FIG. 28 shows a twenty-second embodiment of the connected board to which the present invention is applied. This embodiment of the connected board comprises the connected board shown in FIG. 18. Then on the concave side of the bent portion 308 a conductive substance 614 is provided. In more detail, the inside of the bent portion 308 is filled with an insulating resin 616, and the conductive substance 614 is provided from over the insulating resin 616 to reach as far as the wiring pattern 304.

Other aspects of the construction are the same as the connected board shown in FIG. 18, and therefore description is omitted. According to this embodiment, in addition to the content described with reference to FIG. 18, the concave side of the bent portion 308 can also be used as an electrical connection region, with the conductive substance 614 interposed. In more detail, over the insulating resin 616, electrical connection with the wiring pattern 304 can be achieved, with the conductive substance 614 interposed.

Twenty-Third Embodiment

Figure 29:
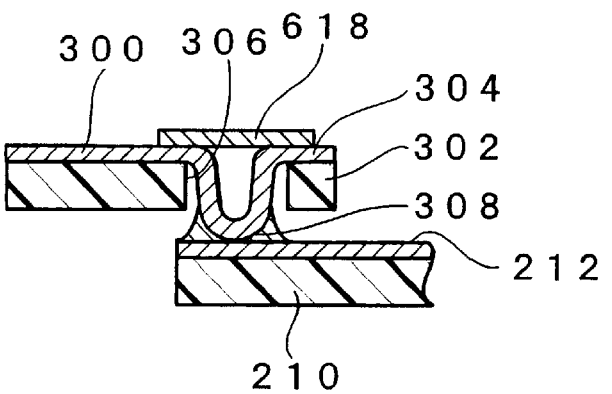
FIG. 29 shows a twenty-third embodiment of the connected board of the present invention.

FIG. 29 shows a twenty-third embodiment of the connected board to which the present invention is applied.

This embodiment of the connected board comprises the connected board shown in FIG. 18. In this embodiment, the insulating resin 616 of the twenty-second embodiment is not provided, and the inside of the bent portion 308 is hollow. Then a conductive substance 618 is provided from over the concavity of the bent portion 308 to reach as far as the wiring pattern 304.

Other aspects of the construction are the same as the connected board shown in FIG. 18, and therefore description is omitted. According to this embodiment, in addition to the content described in the twenty-second embodiment, since the bent portion 308 is easily deformable, stress can be absorbed by the bent portion 308.

Other Modifications

Next, modified embodiments of the semiconductor device of the present invention are described.

(1) Another modification of the semiconductor device of the present invention comprises:

at least one semiconductor chip;

a substrate in which an opening is formed, on which the semiconductor chip is mounted; and a wiring pattern formed on one surface of the substrate and having a bent portion which bents into the opening in the direction of the other surface, wherein the semiconductor chip (electrodes) and the wiring pattern are connected by wires.

This is a wire bonding type of semiconductor device, and may, for example, be a type of CSP.

The method of manufacture thereof comprises:

a step of providing a wiring board manufactured by the above described method, and mounting at least one semiconductor chip on the substrate; and a step of connecting the semiconductor chip (electrodes) and the wiring pattern with wires.

(2) Another modification of the semiconductor device of the present invention comprises:

at least one semiconductor chip, a substrate in which an opening is formed, on which the semiconductor chip is mounted; and a wiring pattern formed on one surface of the substrate and having a bent portion which bents into the opening in the direction of the other surface, and wherein the wiring pattern further includes leads protruding ("overhang") from the substrate, and the semiconductor chip (electrodes) and the leads are connected.

This semiconductor device may also be a type of CSP. It should be noted that between the substrate and the semiconductor chip a gap is left, and this may be filled with resin.

The method of manufacture thereof comprises:

a step of taking a wiring board manufactured by the above described method, and mounting at least one semiconductor chip on the substrate; and a step of connecting the semiconductor chip (electrodes) and the leads.

It should be noted that for the lead connection, single point bonding may be applied.

(3) Another modification of the semiconductor device of the present invention comprises:

at least one semiconductor chip;

a substrate in which an opening is formed, on which the semiconductor chip is mounted; and a wiring pattern formed on one surface of the substrate and having a bent portion which bents into the opening in the direction of the other surface, and wherein a device hole is formed in the substrate, and wherein the wiring pattern further comprises inner leads protruding ("overhang") into the device hole from the substrate, and the semiconductor chip (electrodes) and the inner leads are connected.

This semiconductor device may be a type of T-BGA (Tape-Ball Grid Array).

The method of manufacture thereof comprises:

a step of taking a wiring board manufactured by the above described method, and mounting at least one semiconductor chip on the substrate; and a step of connecting the semiconductor chip (electrodes) and the inner leads.

To this method of manufacture, TAB technology can be applied.

Figure 30:
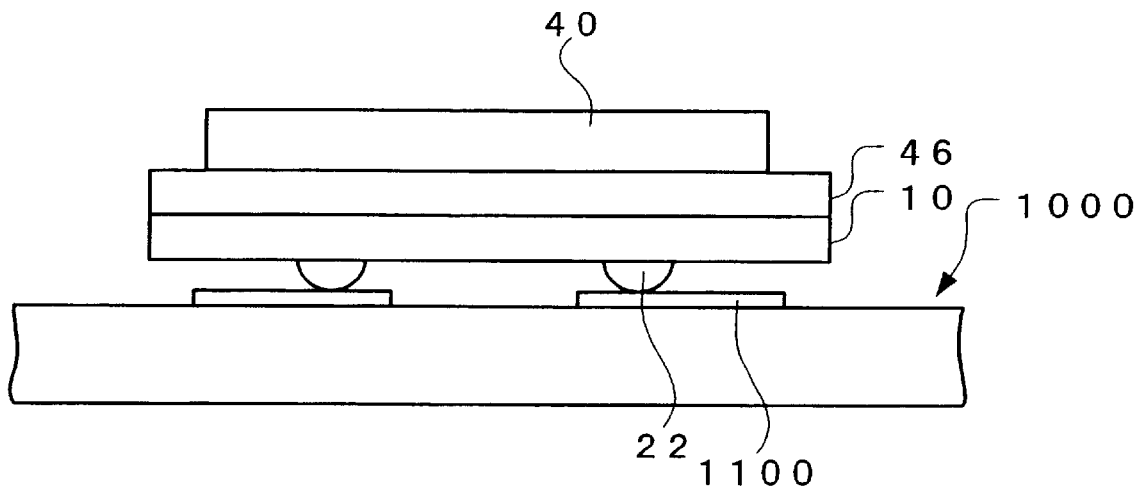
FIG. 30 shows the circuit board of this embodiment.

FIG. 30 shows a circuit board 1000 on which is mounted the semiconductor device shown in FIG. 7. For the circuit board 1000 is generally used an organic substrate such as a glass epoxy substrate or the like. On the circuit board 1000, a wiring pattern 1100 of for example copper is formed to constitute a desired circuit, then by mechanical connection of the wiring pattern 1100 and the external terminals of the semiconductor device (the bent portions 22), electrical connection is achieved. The bent portions 22 and wiring pattern 1100 may be connected using solder, or may be connected with a material not including lead.

Figure 31:
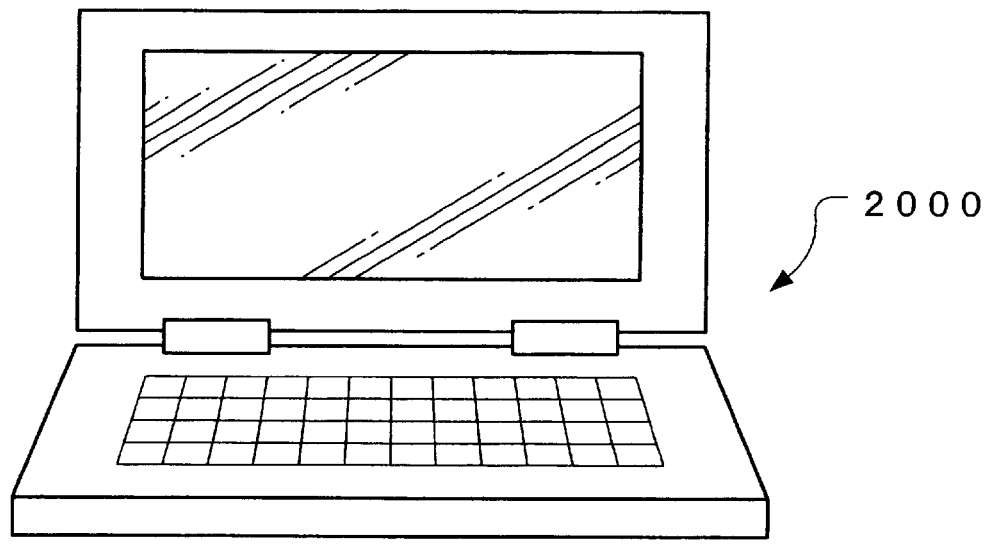
FIG. 31 shows an electronic instrument equipped with a semiconductor device fabricated by a method to which the method of the present invention is applied.

Then as an electronic instrument 2000 equipped with the semiconductor device to which the present invention is applied, in FIG. 31 is shown a notebook personal computer.

It should be noted that the above-described "semiconductor chip" structural element of the present invention may be replaced by "electronic element," and an electronic element (whether an active element or a passive element) can be mounted on the substrate to fabricate an electronic component, in the same way as a semiconductor chip. As electronic components manufactured using such an electronic element may be cited, for example, optical elements, resistors, capacitors, coils, scillators, filters, temperature sensors, thermistors, aristors, variable resistors, and fuses.

What is claimed is:

1. A wiring board, comprising:

a substrate in which an opening is formed;

a wiring pattern having a bent portion, the wiring pattern formed on one surface of the substrate so that the opening and the bent portion overlap each other, the bent portion having a first surface and a second surface opposite to the first surface; and a stress-absorbing material filled in the bent portion, the stress-absorbing material provided on the first surface of the bent portion, wherein at least a portion of the second surface is exposed for electrical connection.

2. The wiring board as defined in claim 1, wherein the bent portion is formed having a height such as not to protrude from another surface of the substrate.

3. The wiring board as defined in claim 1, wherein the bent portion constitutes a protrusion protruding from the other surface of the substrate.

4. The wiring board as defined in claim 3, wherein a protective member thicker than a protruding height of the protrusion is provided on the other surface of the substrate.

5. The wiring board as defined in claim 1, wherein an adhesive is interposed between the substrate and the wiring pattern.

6. The wiring board as defined in claim 1, wherein the bent portion of the wiring pattern is narrower than a diameter of the opening, and forms a bent interconnect.

7. The wiring board as defined in claim 1, wherein the bent portion of the wiring pattern is formed by bending a portion of a land larger than the opening.

8. The wiring board as defined in claim 1, wherein an end of the bent portion of the wiring pattern is fractured.

9. The wiring board as defined in claim 1, wherein an end of the bent portion of the wiring pattern is terminated to avoid the surface of the substrate.

10. The wiring board as defined in claim 1, wherein the opening is a slit, and a plurality of the bent portions are formed within each the opening.

11. A wiring board comprising:

a substrate in which an opening is formed; and a wiring pattern formed on one surface of the substrate, and having a bent portion protruding from the one surface in the direction opposite to the opening.

12. The wiring board as defined in claim 11, wherein an adhesive is interposed between the substrate and the wiring pattern.

13. The wiring board as defined in claim 11, wherein a concavity formed on the concave surface of the bent portion of the wiring pattern is filled with resin.

14. The wiring board as defined in claim 11, wherein the bent portion of the wiring pattern is narrower than a diameter of the opening, and forms a bent interconnect.

15. The wiring board as defined in claim 11, wherein the bent portion of the wiring pattern is formed by bending a portion of a land larger than the opening.

16. The wiring board as defined in claim 11, wherein an end of the bent portion of the wiring pattern is fractured.

17. The wiring board as defined in claim 11, wherein an end of the bent portion of the wiring pattern is terminated to avoid the surface of the substrate.

18. The wiring board as defined in claim 11, wherein the opening is a slit, and a plurality of the bent portions are formed within each the opening.

19. A wiring board comprising:

a substrate in which an opening is formed;

a wiring pattern having a bent portion, the wiring pattern formed on one surface of the substrate so that the opening and the bent portion overlap each other, the bent portion having a first surface and a second surface opposite to the first surface; and a sealing material sealing the opening, the sealing material provided on a concave side of the bent portion, the sealing material provided on the first surface of the bent portion, wherein at least a portion of the second surface is exposed for electrical connection.

20. The wiring board as defined in claim 19, wherein an inside of the bent portion is filled with the sealing material formed of a conductive substance.

21. The wiring board as defined in claim 19, wherein an inside of the bent portion is filled with an insulating resin, and wherein the sealing material is a conductive substance, formed on the insulating resin.

22. The wiring board as defined in claim 19, wherein the sealing material is provided over the concavity to reach as far as the wiring pattern, and leaving an inside of the bent portion hollow.

23. A wiring board comprising:

a substrate in which an opening is formed; and a wiring pattern formed on one surface of the substrate, and having a bent portion protruding from the one surface in the direction opposite to the opening, wherein the opening of the substrate and an inside of the bent portion are filled with a sealing material sealing the opening.

24. A connected board comprising a plurality of wiring boards each of which has a wiring pattern formed on a substrate, wherein a bent portion is formed on the wiring pattern of at least one of the plurality of wiring boards, and wherein the bent portion is connected to and in contact with the wiring pattern of another one of the wiring boards being different from the one of the wiring boards on which the bent portion is formed.

25. The connected board as defined in claim 24, wherein the substrate of the wiring board in which the bent portion is formed is provided with an opening, and wherein the bent portion is formed to overlap with the opening.

26. The connected board as defined in claim 25, wherein the wiring pattern, on which the bent portion is formed, is formed on one surface of the substrate, and wherein the bent portion is formed to protrude from the one surface in the direction opposite to the opening.

27. The connected board as defined in claim 25, wherein the wiring pattern, on which the bent portion is formed, is formed on one surface of the substrate, and wherein the bent portion is formed in the opening along the direction of another surface of the substrate.

28. The connected board as defined in claim 24, wherein the wiring pattern and the bent portion are connected by diffusing respective materials thereof.

29. The connected board as defined in claim 24, wherein the wiring pattern and the bent portion are connected by a conductive member.

30. A connected board comprising a plurality of wiring boards each of which has a wiring pattern formed on a substrate, wherein, on at least one of the plurality of wiring boards, an opening is formed in the substrate, a bent portion is formed in the wiring pattern, the opening and the bent portion overlap each other, the wiring pattern is formed on one surface of the substrate, and a conductive substance is provided on the concave side of the bent portion, and wherein the bent portion is connected to the wiring pattern of another one of the wiring boards being different from the one of the wiring boards on which the bent portion is formed.

31. The connected board as defined in claim 30, wherein an inside of the bent portion is filled with the conductive substance.

32. The connected board as defined in claim 30, wherein an inside of the bent portion is filled with an insulating resin, and wherein the conductive substance is provided on the insulating resin to reach as far as the wiring pattern.

33. The connected board as defined in claim 30, wherein the conductive substance is provided over the concavity to reach as far as the wiring pattern, leaving an inside of the bent portion hollow.

34. A connected board comprising a plurality of wiring boards each of which has a wiring pattern formed on a substrate, wherein, on at least one of the plurality of wiring boards, an opening is formed in the substrate, the wiring pattern is formed on one surface of the substrate and having a bent portion protruding from the one surface in the direction opposite to the opening, and the opening of the substrate and an inside of the bent portion are filled with a conductive substance, and wherein the bent portion is connected to the wiring pattern of another one of the wiring boards being different from the one of the wiring boards on which the bent portion is formed.

35. A semiconductor device comprising:

the wiring board as defined in claim 1; and at least one semiconductor chip mounted on the substrate of the wiring board.

36. The semiconductor device as defined in claim 35, wherein the semiconductor chip is bonded to the substrate being interposed with an anisotropic conductive material constituted by an adhesive in which conductive particles are dispersed.

37. The semiconductor device as defined in claim 36, wherein a part of the anisotropic conductive material is the stress-absorbing material with which the bent portion is filled.

38. The semiconductor device as defined in claim 35, wherein the opening is formed in at least one of inside and outside a mounting region of the semiconductor chip on the substrate.

39. The semiconductor device as defined in claim 35, further comprising a plurality of the semiconductor chips, wherein a part of the substrate is bent, and the plurality of semiconductor chips are stacked.

40. The semiconductor device as defined in claim 35, wherein the opening is formed outside the mounting region of the semiconductor chip on the substrate, and wherein a part of the substrate is bent, and a portion of the substrate excluding the mounting region of the semiconductor chip is adhered to the semiconductor chip.

41. A semiconductor device comprising:

the wiring board as defined in claim 11; and at least one semiconductor chip mounted on the wiring board.

42. The semiconductor device as defined in claim 41, wherein the semiconductor chip is bonded to the substrate being interposed with an anisotropic conductive material constituted by an adhesive in which conductive particles are dispersed.

43. The semiconductor device, wherein a part of the anisotropic conductive material fills the bent portion as defined in claim 1.

44. The semiconductor device as defined in claim 41, wherein the opening is formed in at least one of inside and outside a mounting region of the semiconductor chip on the substrate.

45. The semiconductor device as defined in claim 41, further comprising a plurality of the semiconductor chips, wherein a part of the substrate is bent, and the plurality of semiconductor chips are stacked.

46. The semiconductor device as defined in claim 41, wherein the opening is formed outside the mounting region of the semiconductor chip on the substrate, and wherein a part of the substrate is bent, and a portion of the substrate excluding the mounting region of the semiconductor chip is adhered to the semiconductor chip.

47. A semiconductor device comprising:
the wiring board as defined in claim 19; and
at least one semiconductor chip mounted on the substrate of the wiring board.

48. A semiconductor device comprising:
the wiring board as defined in claim 23; and
at least one semiconductor chip mounted on the substrate of the wiring board.

49. A circuit board on which the semiconductor device as defined in claim 35 is mounted.

50. A circuit board on which the semiconductor device as defined in claim 41 is mounted.

51. A circuit board on which the semiconductor device as defined in claim 47 is mounted.

52. A circuit board on which the semiconductor device as defined in claim 48 is mounted.

53. An electronic instrument having the semiconductor device as defined in claim 35.

54. An electronic instrument having the semiconductor device as defined in claim 41.

55. An electronic instrument having the semiconductor device as defined in claim 47.

56. An electronic instrument having the semiconductor device as defined in claim 48.

57. A method of manufacturing a wiring board, comprising:
forming a bent portion by bending a part of a conductive layer formed on one surface of a substrate and passing over an opening, in the direction of another surface and into the opening; and
filling the bent portion with a stress-absorbing material by providing the stress-absorbing material on a first surface of the bent portion so that at least a portion of a second surface opposite to the first surface is exposed for electrical connection.

58. The method of manufacturing a wiring board as defined in claim 57, wherein the bent portion is formed to have a height such as not to protrude from the other surface of the substrate.

59. The method of manufacturing a wiring board as defined in claim 57, wherein the bent portion protrudes from the other surface of the substrate to form a protrusion.

60. The method of manufacturing a wiring board as defined in claim 59, wherein in the step of forming the bent portion, the opening is mounted on the other surface of the substrate by positioning the opening on a concave die corresponding to the bent portion, and a convex die corresponding to the bent portion is pressed onto the conductive layer from the one surface of the substrate.

61. The method of manufacturing a wiring board as defined in claim 59 further comprising providing a protective member which is thicker than a height of the protrusion, on the other surface of the substrate.

62. The method of manufacturing a wiring board as defined in claim 57, wherein an adhesive is interposed between the substrate and the conductive layer, and wherein the step of forming the bent portion is carried out while drawing the adhesive into the opening.

63. The method of manufacturing a wiring board as defined in claim 57, wherein in the step of forming the bent portion, the bent portion is formed while fracturing the end.

64. The method of manufacturing a wiring board as defined in claim 57, wherein in the step of forming the bent portion, an end of the bent portion is terminated to avoid the surface of the substrate.

65. The method of manufacturing a wiring board as defined in claim 57 further comprising patterning the conductive layer to form a wiring pattern, after the step of forming the bent portion.

66. The method of manufacturing a wiring board as defined in claim 57 further comprising:
adhering a conductive layer to the substrate; and
patterning the conductive layer to form a wiring pattern, wherein the step of forming the bent portion is carried out on the conductive layer as the wiring pattern.

67. The method of manufacturing a wiring board as defined in claim 65 further comprising applying plating to the convex surface of the bent portion, after forming the wiring pattern.

68. A method of manufacturing a wiring board, comprising forming a bent portion by bending a part of a conductive layer formed on one surface of a substrate having an opening formed therein so as to protrude from the one surface in a direction opposite to the opening.

69. The method of manufacturing a wiring board as defined in claim 68, wherein an adhesive is interposed between the substrate and the conductive layer, and wherein the step of forming the bent portion is carried out while drawing the adhesive into the opening.

70. The method of manufacturing a wiring board as defined in claim 68, wherein in the step of forming the bent portion, the bent portion is formed while fracturing the end.

71. The method of manufacturing a wiring board as defined in claim 68, wherein in the step of forming the bent portion, an end of the bent portion is terminated to avoid the surface of the substrate.

72. The method of manufacturing a wiring board as defined in claim 68 further comprising filling a concavity formed by the concave surface of the bent portion of the conductive layer with resin, after the step of forming the bent portion.

73. The method of manufacturing a wiring board as defined in claim 68 further comprising patterning the conductive layer to form a wiring pattern, after the step of forming the bent portion.

74. The method of manufacturing a wiring board as defined in claim 68 further comprising:

adhering a conductive layer to the substrate; and patterning the conductive layer to form a wiring pattern, wherein the step of forming the bent portion is carried out on the conductive layer as the wiring pattern.

75. The method of manufacturing a wiring board as defined in claim 73 further comprising applying plating to the convex surface of the bent portion, after forming the wiring pattern.

76. A method of manufacturing a wiring board, comprising:

forming a bent portion by bending a part of a conductive layer formed on one surface of a substrate and passing over an opening, in the direction of another surface and into the opening; and providing a conductive substance on the concave side of the bent portion.

77. The method of manufacturing a wiring board as defined in claim 76, wherein an inside of the bent portion is filled with the conductive substance.

78. The method of manufacturing a wiring board as defined in claim 76, wherein an inside of the bent portion is filled with an insulating resin, and wherein the conductive substance is provided on the insulating resin to reach as far as the wiring pattern.

79. The method of manufacturing a wiring board as defined in claim 76, wherein the conductive substance is provided over the concavity to reach as far as the wiring pattern, leaving an inside of the bent portion hollow.

80. A method of manufacturing a wiring board comprising:

forming a bent portion by bending a part of a conductive layer formed on one surface of a substrate so as to protrude from the one surface in the direction opposite to the opening; and filling the opening of the substrate and an inside of the bent portion with a conductive substance.

81. A method of manufacturing a connected board in which a plurality of wiring boards are connected, each of the wiring boards having a wiring pattern formed on a substrate, the method comprising at least:

forming a bent portion on the wiring pattern of at least one of the plurality of wiring boards; and connecting the bent portion to the wiring pattern of another of the wiring boards different from the one of the wiring boards on which the bent portion is formed.

82. The method of manufacturing a connected board as defined in claim 81, wherein the substrate of the wiring board in which the bent portion is formed is provided with an opening, and wherein the bent portion is formed to overlap with the opening.

83. The method of manufacturing a connected board as defined in claim 82, wherein the wiring pattern, on which the bent portion is formed, is formed on one surface of the substrate, and wherein the bent portion is formed to protrude from the one surface in the direction opposite to the opening.

84. The method of manufacturing a connected board as defined in claim 82, wherein the wiring pattern, on which the bent portion is formed, is formed on one surface of the substrate, and wherein the bent portion is formed in the opening along the direction of another surface of the substrate.

85. The method of manufacturing a connected board as defined in claim 81, wherein the bent portion and the wiring pattern of another of the wiring boards different from the one of the wiring boards on which the bent portion is formed are connected by diffusing respective materials thereof.

86. The method of manufacturing a connected board as defined in claim 81, wherein the bent portion and the wiring pattern of another of the wiring boards different from the one of the wiring boards on which the bent portion is formed are connected by a conductive member.

87. A method of manufacturing a connected board in which a plurality of wiring boards are connected, each of the wiring boards having a wiring pattern formed on a substrate, wherein an opening is formed in the substrate for at least one of the plurality of wiring boards, wherein the method comprises:

forming a bent portion in the wiring pattern of the substrate in which the opening is formed, so that the opening and the bent portion overlap each other;

providing a conductive substance on the concave side of the bent portion; and connecting the bent portion and the wiring pattern of another one of the wiring boards being different from the one of the wiring boards on which the bent portion is formed.

88. The method of manufacturing a connected board as defined in claim 87, wherein an inside of the bent portion is filled with the conductive substance.

89. The method of manufacturing a connected board as defined in claim 87, wherein an inside of the bent portion is filled with an insulating resin, and wherein the conductive substance is provided on the insulating resin to reach as far as the wiring pattern.

90. The method of manufacturing a connected board as defined in claim 87, wherein the conductive substance is provided over the concavity to reach as far as the wiring pattern, leaving an inside of the bent portion hollow.

91. A method of manufacturing a connected board in which a plurality of wiring boards are connected, each of the wiring boards having a wiring pattern formed on a substrate, wherein an opening is formed in the substrate for at least one of the plurality of wiring boards, and the wiring pattern is formed on one surface of the substrate, wherein the method comprises:

forming a bent portion by bending the wiring pattern of the substrate, in which the opening is formed to protrude from the one surface in the direction opposite to the opening;

filling the opening of the substrate and an inside of the bent portion with a conductive substance; and connecting the bent portion and the wiring pattern of another one of the wiring boards being different from the one of the wiring boards on which the bent portion is formed.

92. A method of manufacturing a semiconductor device comprising mounting at least one semiconductor chip on the substrate of a wiring board fabricated by the method as defined in claim 57.

93. The method of manufacturing a semiconductor device as defined in claim 92, wherein in the step of mounting the semiconductor chip, the semiconductor chip is bonded to the substrate being interposed with an anisotropic conductive material constituted by an adhesive in which conductive particles are dispersed.

94. The method of manufacturing a semiconductor device as defined in claim 92, wherein a plurality of the semiconductor chips are mounted on the substrate, wherein the substrate is a flexible substrate, and wherein a part of the substrate is bent, and the plurality of semiconductor chips are stacked.

95. The method of manufacturing a semiconductor device as defined in claim 92, wherein the substrate is a flexible substrate, and wherein a part of the substrate is bent, and an upper surface of the semiconductor chip is adhered to the substrate.

96. A method of manufacturing a semiconductor device comprising mounting at least one semiconductor chip on the substrate of a wiring board fabricated by the method as defined in claim 68.

97. The method of manufacturing a semiconductor device as defined in claim 96, wherein in the step of mounting the semiconductor chip, the semiconductor chip is bonded to the substrate being interposed with an anisotropic conductive material constituted by an adhesive in which conductive particles are dispersed.

98. The method of manufacturing a semiconductor device as defined in claim 96, wherein a plurality of the semiconductor chips are mounted on the substrate, wherein the substrate is a flexible substrate, and wherein a part of the substrate is bent, and the plurality of semiconductor chips are stacked.

99. The method of manufacturing a semiconductor device as defined in claim 96, wherein the substrate is a flexible substrate, and wherein a part of the substrate is bent, and an upper surface of the semiconductor chip is adhered to the substrate.

100. A method of manufacturing a semiconductor device comprising mounting at least one semiconductor chip on the substrate of a wiring board fabricated by the method as defined in claim 76.

101. A method of manufacturing a semiconductor device comprising mounting at least one semiconductor chip on the substrate of a wiring board fabricated by the method as defined in claim 80.

\* \* \* \* \*